United States Patent
Tofukuji et al.

(10) Patent No.: US 7,153,116 B2
(45) Date of Patent: Dec. 26, 2006

(54) RESIN MOLDING MACHINE

(75) Inventors: Shigeyuki Tofukuji, Chikuma (JP); Tomoo Sakamoto, Chikuma (JP)

(73) Assignee: Apic Yamada Corporation, Nagano (JP)

( * ) Notice: Subject to any disclaimer, the term of this patent is extended or adjusted under 35 U.S.C. 154(b) by 357 days.

(21) Appl. No.: 10/718,571

(22) Filed: Nov. 24, 2003

(65) Prior Publication Data
US 2004/0105909 A1 Jun. 3, 2004

(30) Foreign Application Priority Data
Nov. 29, 2002 (JP) .............................. 2002-348420

(51) Int. Cl.
*B29C 45/14* (2006.01)
*H01L 21/56* (2006.01)

(52) U.S. Cl. .................. 425/89; 425/116; 425/125; 425/127; 425/129.1; 425/453; 425/215

(58) Field of Classification Search ................. 425/89, 425/116, 125, 127, 129.1, 453, 215
See application file for complete search history.

(56) References Cited

U.S. PATENT DOCUMENTS 2,386,697 A * 10/1945 Lynch ......................... 425/121
4,442,056 A * 4/1984 Slepcevic ...................... 264/161
5,053,173 A * 10/1991 Sticht ............................ 264/39
6,478,562 B1 * 11/2002 Miyajima ...................... 425/89
6,908,293 B1 * 6/2005 Furuta et al. ................ 425/116

FOREIGN PATENT DOCUMENTS

| JP | 61-46049 B2 | | 10/1986 |
| JP | 01094630 A | * | 4/1989 |
| JP | 03093238 A | * | 4/1991 |
| JP | 06021126 A | * | 1/1994 |
| JP | 09048041 A | * | 2/1997 |
| JP | 10335360 A | * | 12/1998 |
| JP | 11010654 A | * | 1/1999 |

* cited by examiner

*Primary Examiner*—Robert B. Davis
(74) *Attorney, Agent, or Firm*—Birch, Stewart, Kolasch & Birch, LLP

(57) ABSTRACT

The resin molding machine has a simple molding die, which can be easily maintained, and is capable of molding a work without pretreatments. The resin molding machine for molding the work with resin. The resin molding machine comprises: a press section having a molding die; a cavity plate having a cavity hole, which defines a shape and thickness of a resin mold section of the work; a mechanism for repeatedly carrying the cavity plate into and out from the press section; and a mechanism for positioning the cavity plate onto the molding die.

17 Claims, 17 Drawing Sheets

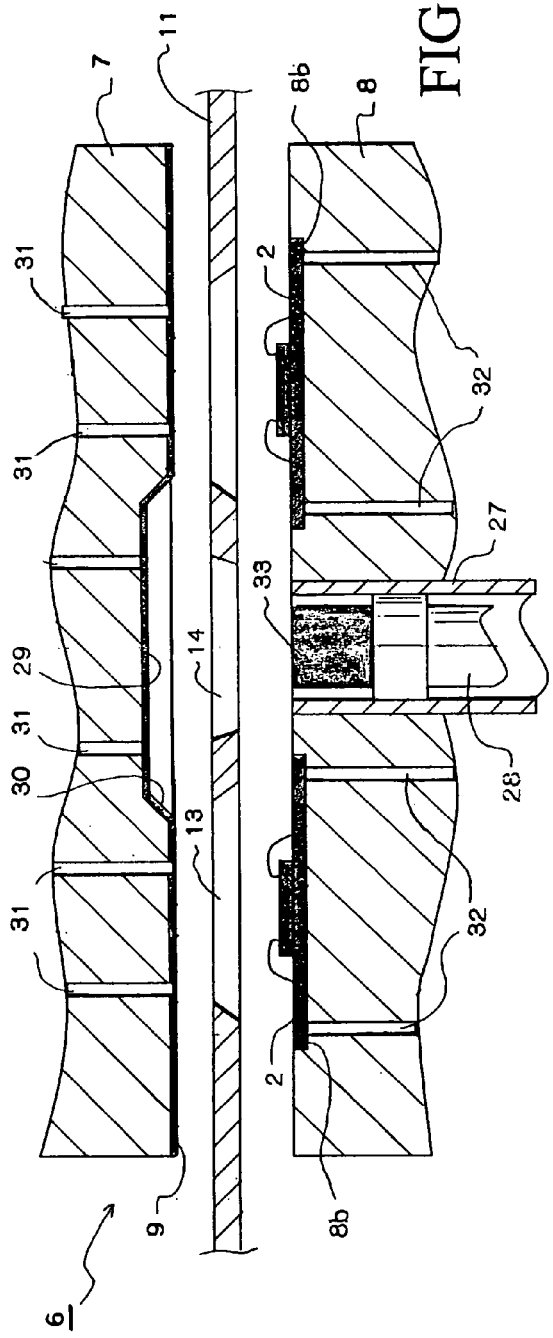
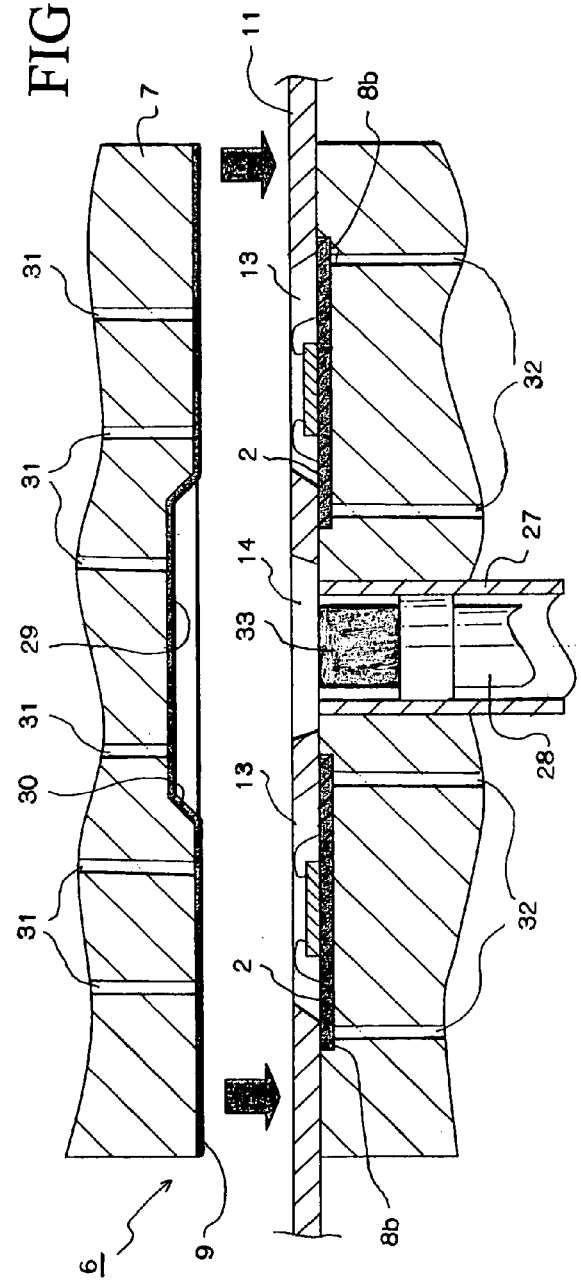

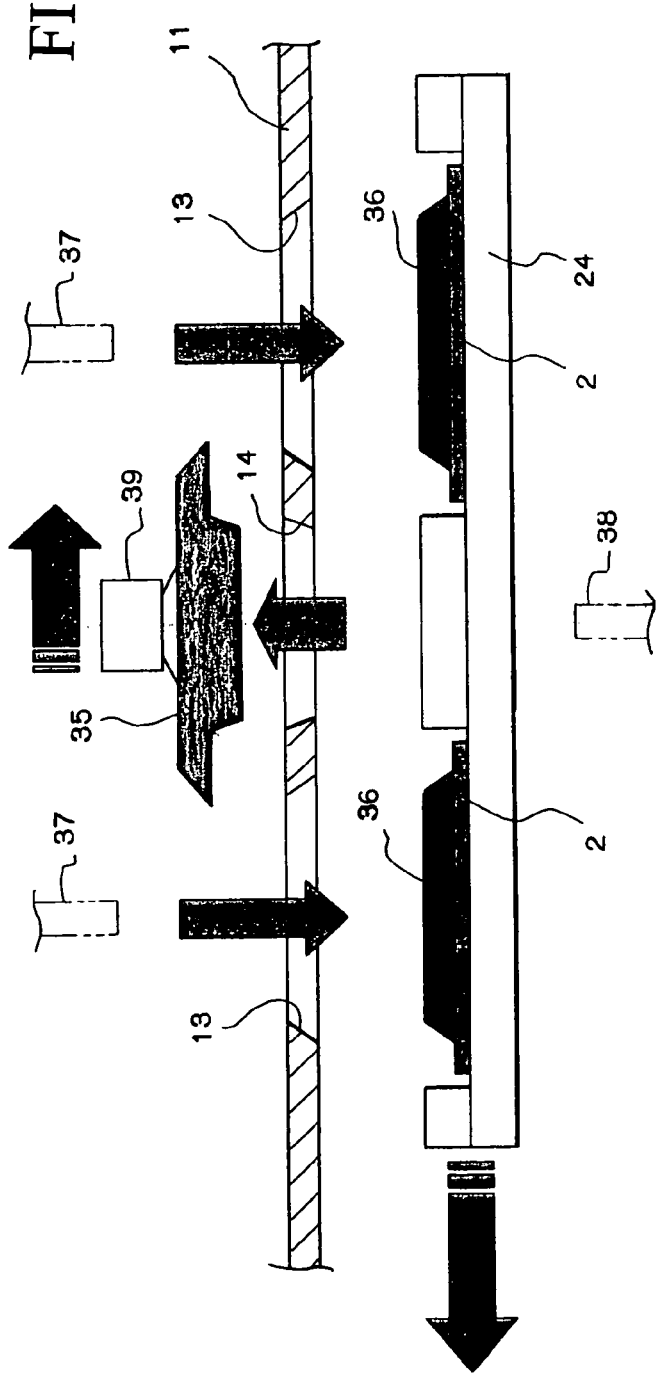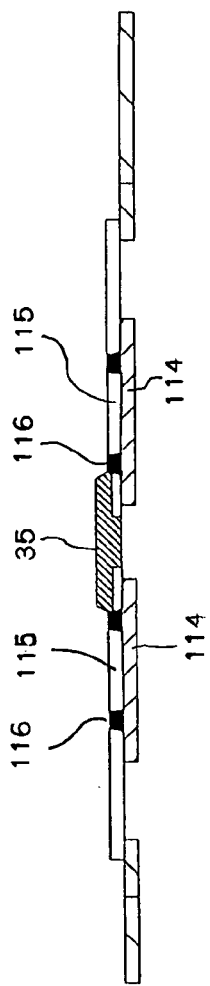

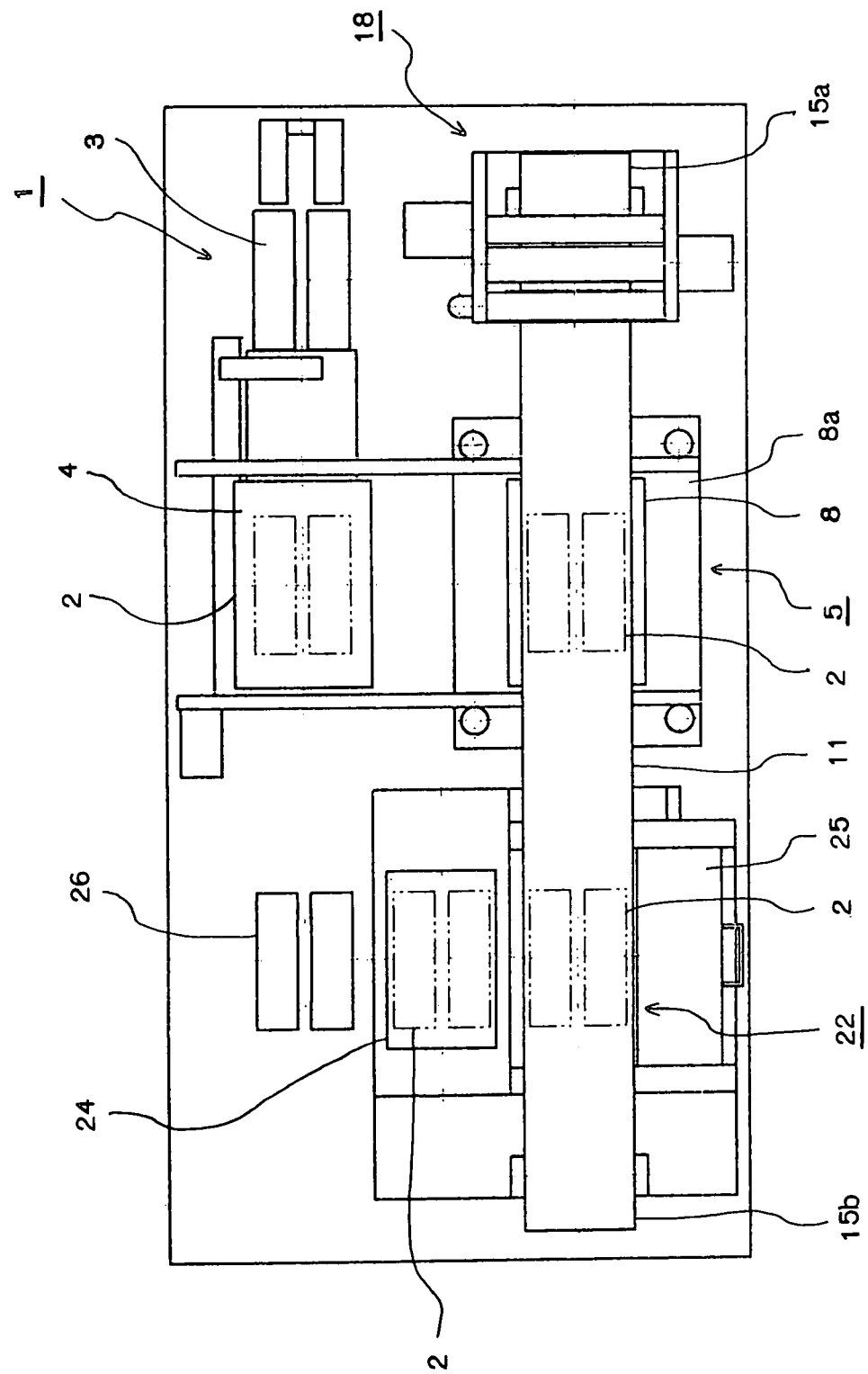

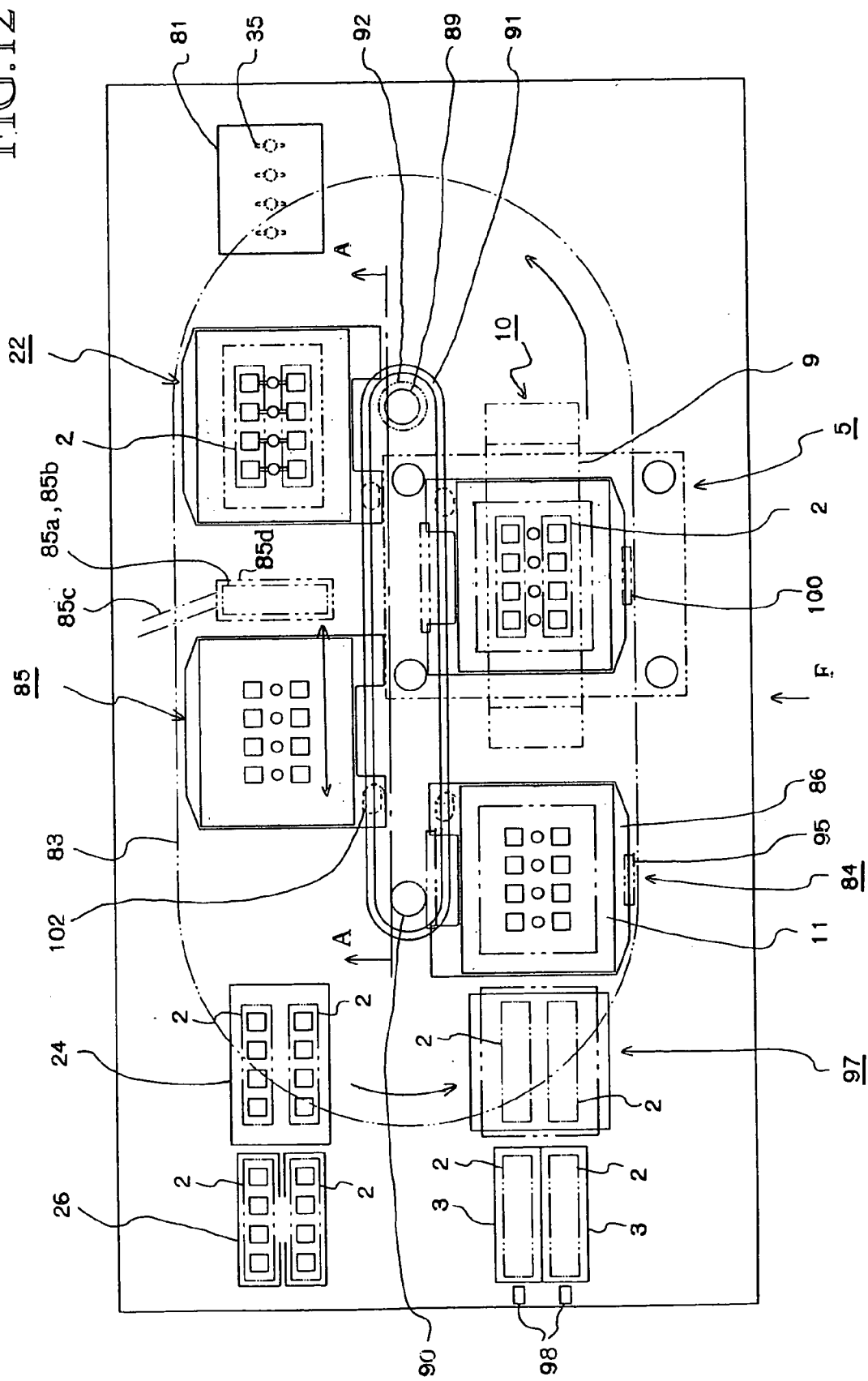

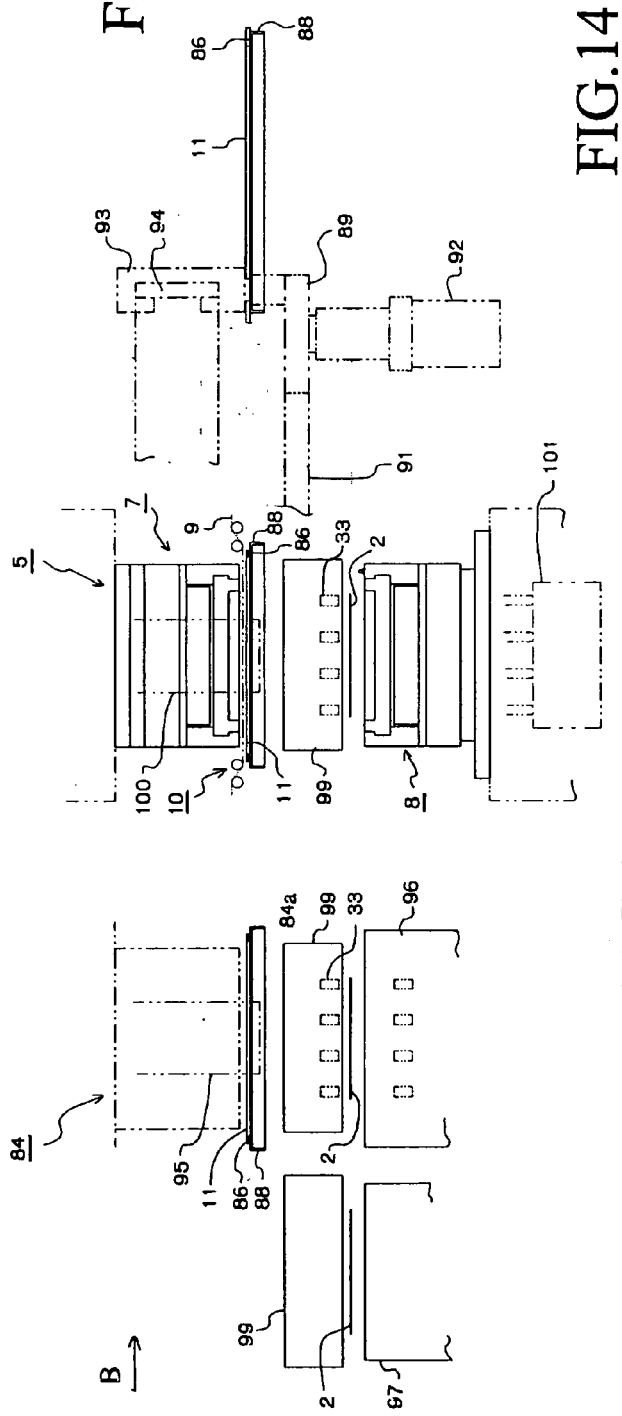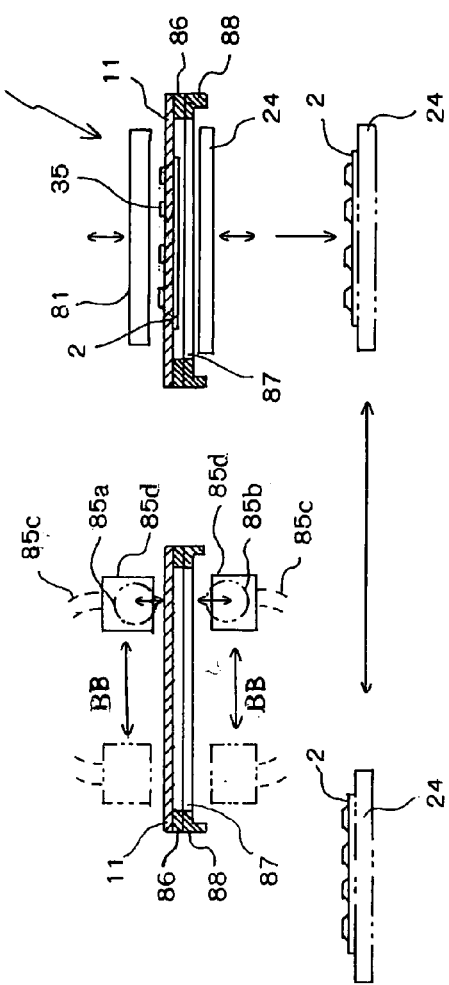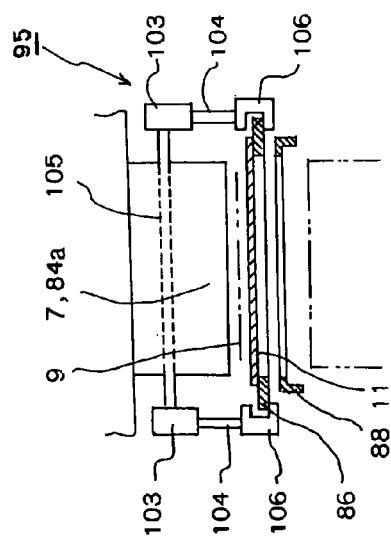

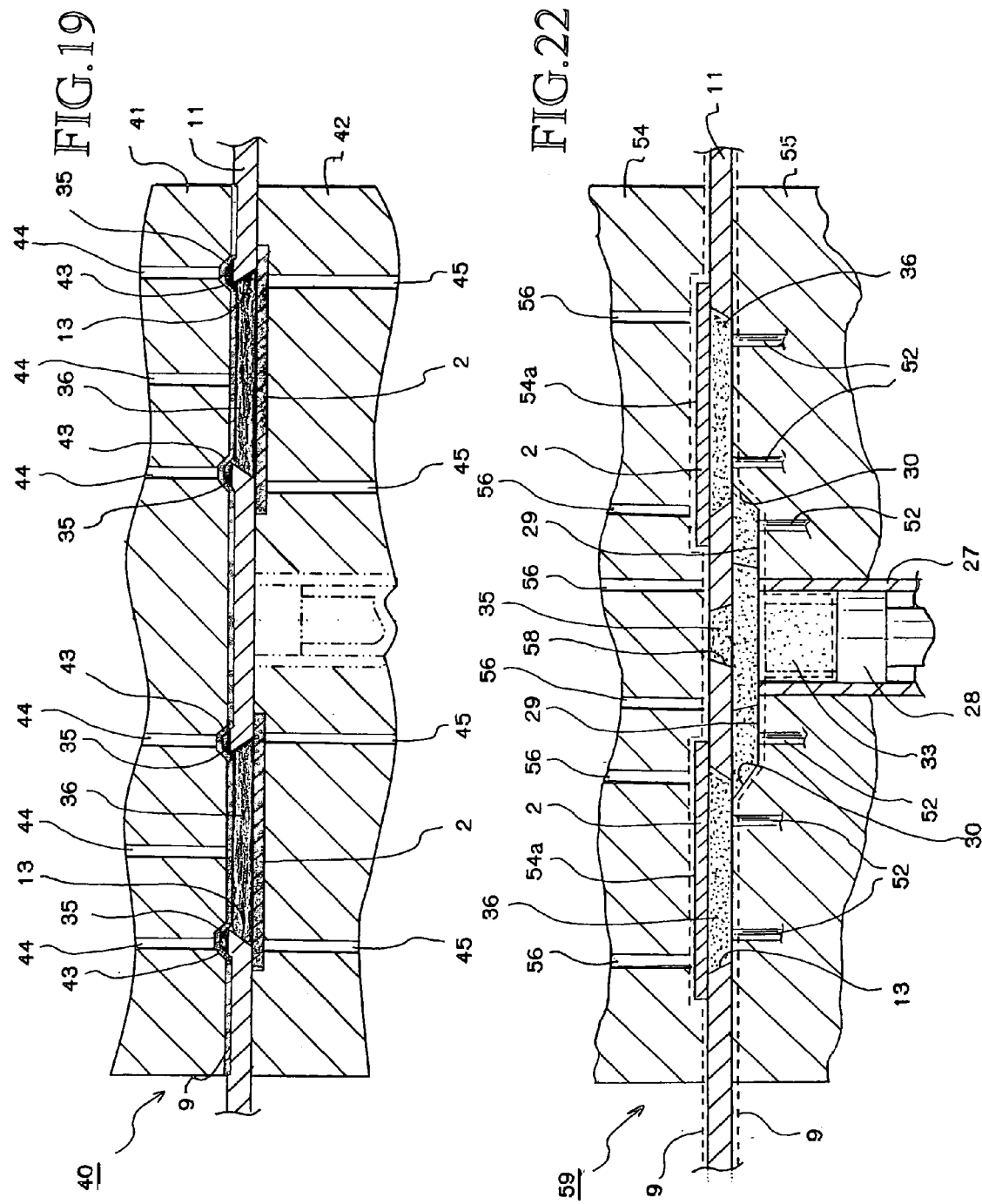

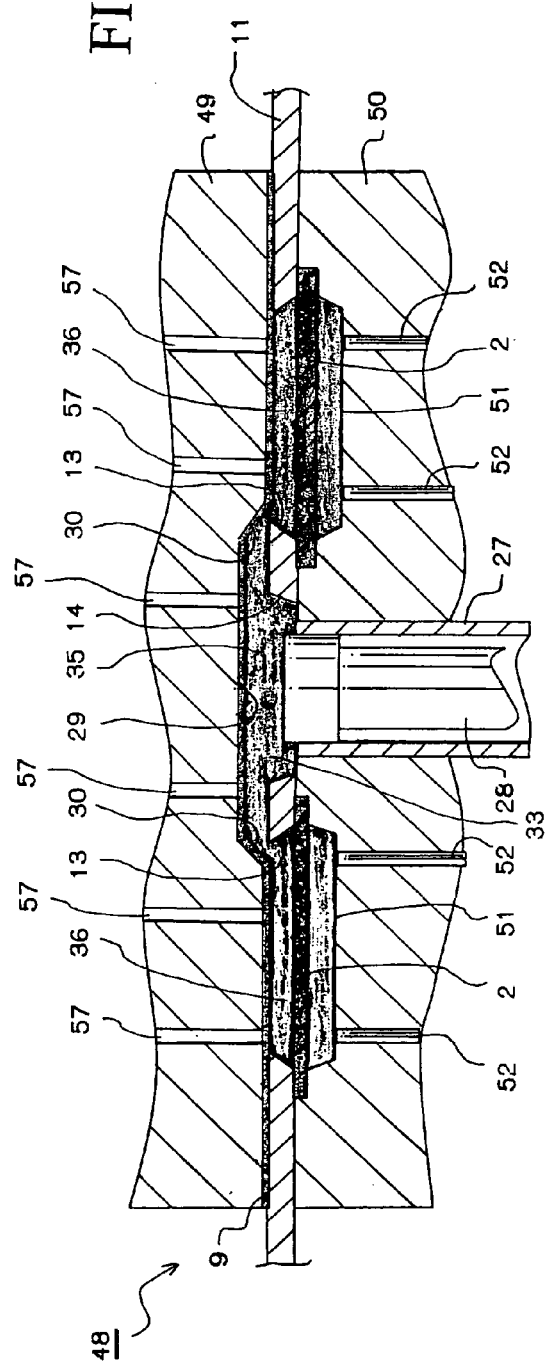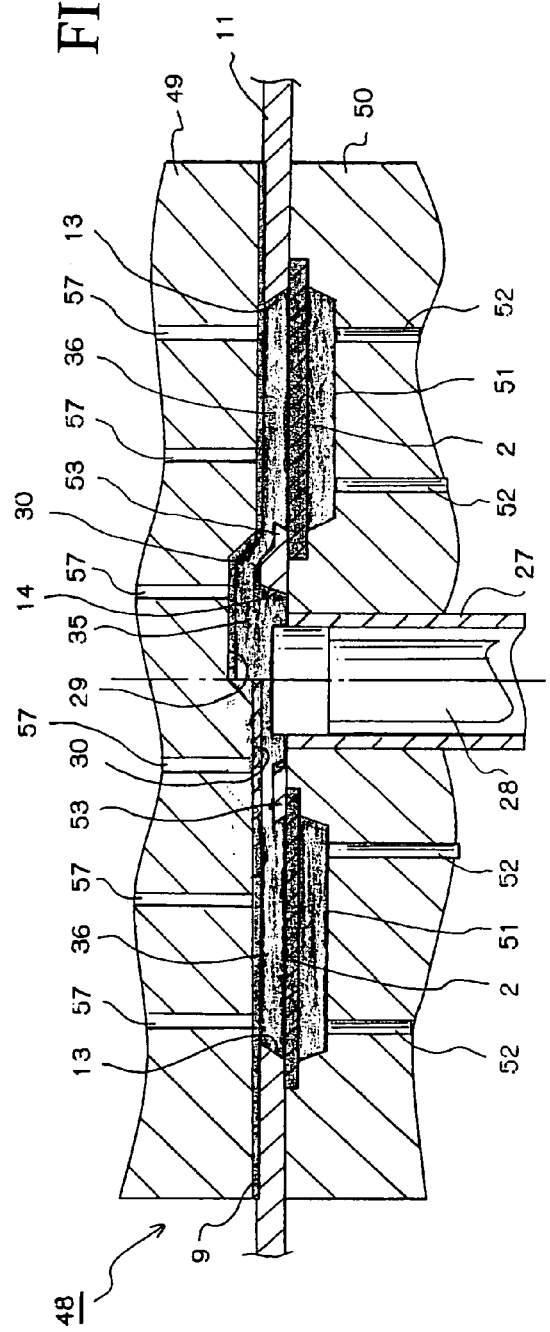

RESIN MOLDING MACHINE

This Nonprovisional application claims priority under 35 U.S.C. § 119(a) on Patent Application No. 2002-348420 filed in Japan on Nov. 29, 2002, the entire contents of which are hereby incorporated by reference.

BACKGROUND OF THE INVENTION

The present invention relates to a resin molding machine, more precisely relates to a resin molding machine, in which a work is clamped and molded with resin in a molding die.

A transfer molding machine, which molds resin mold sections (package sections) of semiconductor devices with resin, has been known as an example of resin molding machines. In the transfer molding machine, works, e.g., mere substrates, plastic boards on which semiconductor chips are mounted, lead frames on which semiconductor chips are mounted, are set in a molding die having cavities and clamped by the molding die. Resin supplied in a pot is pressurized by a plunger so as to send the resin to the cavities via resin paths (runners and gates). By filling the cavity, the mold sections of the work are molded with the resin.

For example, CSP (Chip Size Package) type semiconductor devices are manufactured by simultaneously molding semiconductor chips, which are metrically arranged on one side face of a work, with resin. Then, the molded chips on the work are respectively cut by a dicing machine. The cut pieces become the semiconductor devices.

The molding die includes an upper die and a lower die. To fill the cavities, in which the semiconductor chips are accommodated, with the resin, runners and gates for introducing the resin are formed on a substrate of the work. Therefore, special pretreatments of the substrate, e.g., gold plating for degating useless resin, are required, so that number of manufacturing steps must be increased. Namely, manufacturing efficiency is lowered, and manufacturing costs must be increased.

In the case of molding the one side of the substrate of the work, resin fins are extended from edges of the substrate, so that maintenance of the molding die is required.

To resin-mold prescribed areas of the substrate without touching the resin with other areas, a method of resin molding, in which a cavity plate having cavity holes is piled on the substrate (a printed circuit board), was proposed (see Japanese Patent Gazette No. 61-46049).

However, in the method disclosed in the Japanese Patent Gazette, the circuit board and the cavity plate, whose size is almost equal to that of the circuit board, are merely piled by respectively piercing pins of a molding die. The gazette does not disclose how to carry the cavity plate and the circuit board into the molding die, how to carry out the molded circuit board therefrom, how to remove useless resin from the molded products and how to separate the cavity plate from the molded circuit board. Further, runners and gates are formed on a clamping face of the molding die, so the molding die must be frequently cleaned and maintained. Therefore, manufacturing efficiency of the resin molding machine must be lowered.

SUMMARY OF THE INVENTION

An object of the present invention is to provide a resin molding machine, which has a simple molding die, which can be easily maintained, and which is capable of molding a work without pretreatments.

To achieve the object, the present invention has following structures.

Namely, the resin molding machine for molding a work with resin, comprises:

a press section having a molding die for clamping and molding the work;

a cavity plate having a cavity hole, which defines a shape and thickness of a resin mol section of the work;

means for setting the work in the press section;

means for repeatedly carrying the cavity plate into and out from the press section; and means for positioning the cavity plate onto the molding die. With this structure, the structure of the molding die can be simple and easily maintained. The positioning means correctly positions the cavity plate onto the molding die, and the molding die clamps and mold the work, so that the molding die is capable of molding the work without executing pretreatments, e.g., gold plating, to the work. Further, by changing the cavity plate, different kinds of works, which have different sizes, can be molded without a big modification of the machine. The molded work can be separated from the molding die by opening the molding die and movement of the cavity plate, so no ejector pins are required. The molded work can be carried out from the press section together with the cavity plate, so the structure of the machine can be simple.

In the resin molding machine, the cavity plate may be a metal belt, which is circulated or reciprocally moved on a clamping face of the molding die.

In the resin molding machine, the cavity plate may be wound on a couple of rollers, and the cavity plate may be separated away from clamping face of the molding die and conveyed between the rollers with a prescribed pitch after the work is molded.

In the resin molding machine, the cavity plate may be cleaned before carrying into the press section.

In the resin molding machine, the cavity plate may be a metal plate, which is moved on and along a circulating track, whose surface is parallel to a clamping face of the molding die. With this structure, deformation of a surface of the metal plate, which is caused by reuse, can be prevented, and flatness of the surface of the metal plate can be maintained. Therefore, thin works can be properly molded, and quality of products can be improved.

In the resin molding machine, the cavity plate may be preheated before carrying into the press section. With this structure, the cavity plate, whose heat capacity is relatively small, is preheated before carrying into the press section, so that a time for molding the work can be shortened.

In the resin molding machine, the cavity plate may be circulated via a preheating section, the press section, a degating section and a cleaning section, and the circulation of the cavity plate may be synchronized with actions performed in the sections. With this structure, waiting time between the sections can be shortened, so that manufacturing efficiency can be improved.

In the resin molding machine, the work which has been molded may be conveyed from the press section to a degating section, at which useless resin is separated from a molded product and they are separately collected.

In the resin molding machine, the molding die may be a transfer molding die, whose clamping face including resin paths is covered with a release film.

In the resin molding machine, the molding die may be a compression molding die including a pair of dies, a work holding section, on which the work is mounted, may be provided in one of the dies, an overflow cavity, which communicates to the cavity hole of said cavity plate, may be provided in the other die, and the other die may be covered with a release film.

By covering the clamping face including the resin paths with the release film, inner faces of the resin paths are covered with the release film, so no resin contact the clamping face. Therefore, maintenance of the molding die can be simplified.

In the resin molding machine, a work holding section, on which the substrate of the work is mounted, may be provided in the molding die, and means for adjusting variations of thickness of the substrate may be provided to the work holding section. With this structure, the variations of the thickness of the substrate can be absorbed, so that damage of the work can be prevented and reliability of the machine can be improved.

Further, by employing the cavity plate having a vertical gate communicated to the concave groove, amount of useless resin or scraps can be reduced.

BRIEF DESCRIPTION OF THE DRAWINGS

Embodiments of the present invention will now be described by way of examples and with reference to the accompanying drawings, in which:

FIGS. 1–7 are explanation views showing molding steps of a resin molding machine of a first embodiment;

FIG. 9 is a plan view of the resin molding machine shown in FIG. 8;

FIG. 12 is a plan view of a resin molding machine of a second embodiment;

FIG. 13 is a front view of the resin molding machine shown in FIG. 12 seen from an arrow F;

FIG. 14 is an explanation view of the resin molding machine shown in FIG. 12 seen from an arrow A;

FIG. 15 is a front view of the resin molding machine shown in FIG. 13 seen from an arrow B;

FIGS. 17–19 are explanation views showing molding steps of a resin molding machine of a third embodiment;

FIGS. 20 and 21 are explanation views showing molding steps of a resin molding machine of a fourth embodiment;

FIG. 22 is an explanation view of a molding die of a fifth embodiment;

FIG. 28 is a sectional view of a molded work having no semiconductor chips are mounted.

DETAILED DESCRIPTION OF THE EMBODIMENT

Preferred embodiments of the present invention will now be described in detail with reference to the accompanying drawings.

First Embodiment

Figure 8:
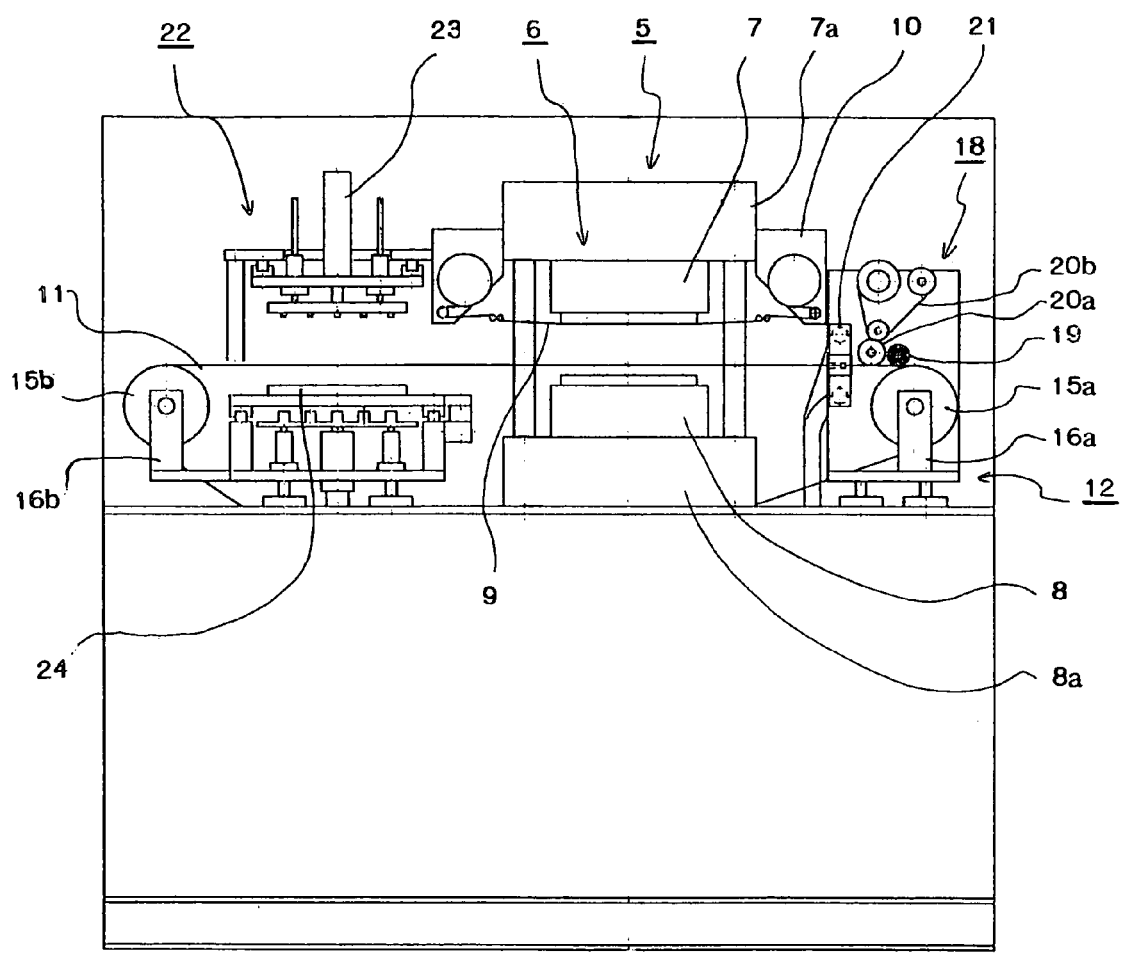
FIG. 8 is a front view of the resin molding machine of the first embodiment.
Figure 10A:
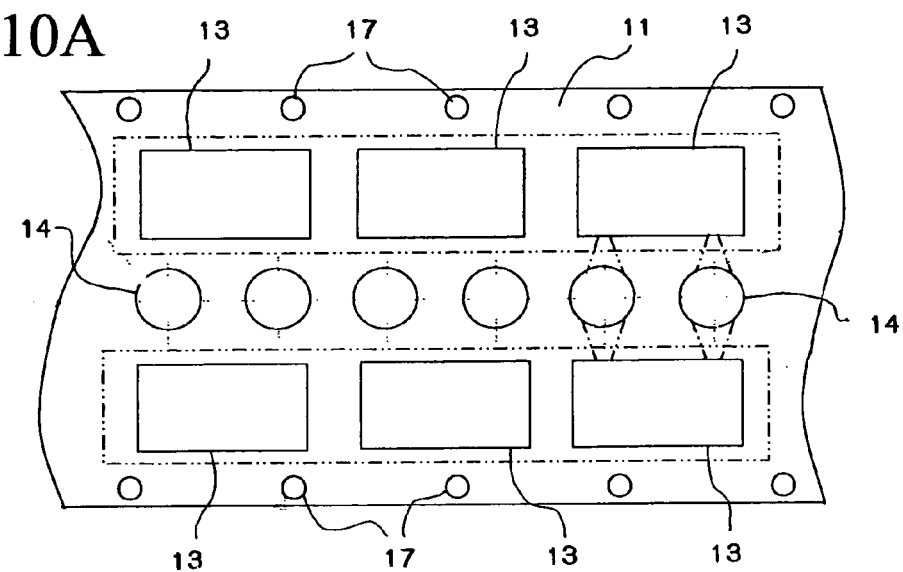
FIG. 10A is a plan view of a cavity plate.
Figure 10B:
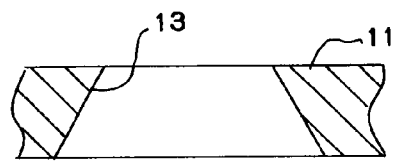
FIG. 10B is a sectional view of the cavity plate.
Figure 11A:
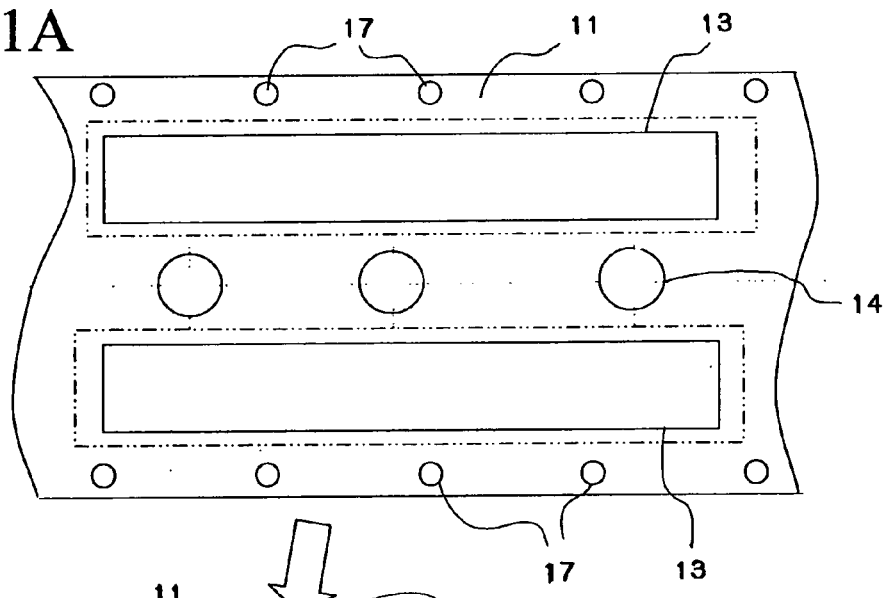
FIG. 11A is a plan view of another cavity plate.
Figure 11B:
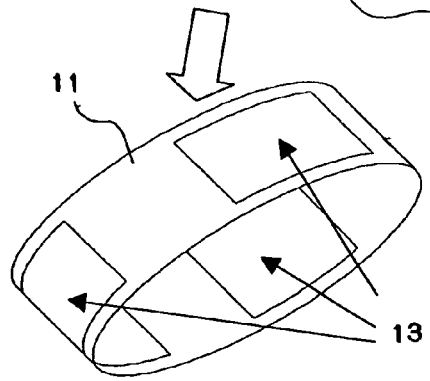
FIG. 11B is a perspective view of the cavity plate.

A first embodiment will be explained with reference to FIGS. 1–11B. FIGS. 1–7 are explanation views showing molding steps of a resin molding machine of the first embodiment; FIG. 8 is a front view of the resin molding machine; FIG. 9 is a plan view of the resin molding machine; FIG. 10A is a plan view of a cavity plate of the resin molding machine; FIG. 10B is a sectional view of the cavity plate; FIG. 11A is a plan view of another cavity plate; and FIG. 11B is a perspective view of the cavity plate shown in FIG. 11A.

Firstly, an outline of the resin molding machine will be explained. The resin molding machine is a transfer molding machine.

In FIGS. 8 and 9, a work feeding section 1 sends works 2 from a feeding magazine toward a loader 4. In the present embodiment, semiconductor chips are mounted on a plastic substrate of each work 2, but other types of works, e.g., lead frames on which semiconductor chips are mounted, mere substrates, may be molded by the resin molding machine of the present embodiment.

The works 2 held by the loader 4 are carried into a press section 5. While a cavity plate 11 is separated from an upper face of a lower die 8, the loader 4 is moved between the cavity plate 11 and the lower die 8. Note that, the loader 4 may simultaneously or separately carry the works 2 and resin materials, e.g., resin tablets, to the lower die 8.

The press section 5 has a molding die 6. The molding die 6 is constituted by an upper die 7, which is a fixed die, and the lower die 8, which is a movable die. The lower die 8 is vertically moved by a clamping mechanism including an electric motor. A film feeding mechanism 10, which feeds a belt-shaped release film 9 onto a clamping face of the upper die 7, is provided to an upper base 7a. The film feeding mechanism 10 synchronously sends the release film 9 from a feeding reel to a collecting reel with prescribed pitches.

The release film 9 covers areas of the molding die 6, which contact the resin for molding the works 2. In the present embodiment, the release film 9 is sucked and held on the clamping face of the upper die 7 with tension. The release film 9 has enough heat resistivity to temperature of the heated molding die 6, enough elasticity and enough extensibility. Further, the release film 9 is easily peelable from the clamping face of the upper die 7. The release film 9 is made of PTFE, ETFE, PET, FEP, glass cloth including fluorine, polypropylene, polyvinylidene chloride, etc. By using the release film 9, ejector pins for ejecting molded works and a cleaner, which cleans the surfaced of the molding die 6 after molding, can be omitted. Note that, if the release film 9 is not used, the ejector pins and the cleaner will be provided in the resin molding machine.

A plate carrying mechanism 12, which carries the cavity plate 11 into a space between the upper die 7 and the lower die 8, is provided on the both sides of the press section 5. As shown in FIGS. 10A and 10B, the cavity plate 11 has a plurality of cavity holes 13, each of which defines a shape and thickness of a resin mold section (a package section) of the work 2, and pot holes 14 are bored in the cavity plate 11. The cavity holes 13 and the pot holes 14 are through-holes.

The cavity hole 13 defines the shape of the mold section (the package section) of the work 2, and a distance between inner faces is gradually made longer toward the substrate of the work 2 (see FIG. 10B). On the other hand, an inner diameter of the pot hole 14 is gradually made greater toward the clamping face of the upper die 7. The works 2 are positioned to respectively accommodate the semiconductor chips in the cavity holes 13 of the cavity plate 11 and set in the lower die 8 of the press section 5. The works 2 and the cavity plate 11 are clamped by the upper die 7, whose clamping face is covered with the release film 9, and the lower die 8, then the works 2 are molded with the resin.

The shapes of the cavity holes 13 are designed according to products. Examples are shown in FIGS. 10A and 11A. In FIG. 10A, the cavity holes 13 are formed into short rectangular holes; one semiconductor chip is accommodated in each cavity hole 13 and molded therein. In FIG. 11A, the cavity holes 13 are formed into long rectangular holes; a plurality of semiconductor chip are accommodated in each cavity hole 13 and molded therein. A part of the cavity plate 11 shown in FIG. 10A or 11A is used for one molding action. Note that, in FIGS. 10A and 11A, outlines of the works 2 are shown by two-dot chain lines.

Grooves, which communicate the pot holes 14 to the cavity holes 13, may be formed in the cavity plate 11 instead of culs 29 formed in the upper die 6.

In the present embodiment, the cavity plate 11 is a metal belt made of, for example, stainless steel, titanium, nickel alloy, etc. The thickness of the metal belt is selected on the basis of the thickness of the resin mold sections of the works 2. For example, the thickness of the metal belt is 0.05–1.5 mm. The cavity plate 11 must have enough heat resistivity, enough abrasion resistivity and enough elasticity, so it may be made of proper synthetic resin, e.g., polyimide, instead of the metal.

To easily peel products from the cavity plate 11, one or both faces of the cavity plate 11 and inner faces of the cavity holes 13 and the pot holes 14 may be coated with fluoric resin, e.g., Teflon (trademark).

In the present embodiment, as shown in FIG. 11B, the cavity plate 11 is formed into an endless belt, which circulates along the clamping face of the molding die 6. Sprocket wheels 15a and 15b, which circulates the cavity belt 11, are respectively located on the both sides of the press section 5 (see FIG. 8). The sprocket wheels 15a and 15b are respectively rotatably provided on supporting bases 16a and 16b. Feeding holes 17 are formed along both side edges of the cavity plate 11 with regular separations. Feeding teeth, which are radially projected outward from circumferential faces of the sprocket wheels 15a and 15b, engage with the feeding holes 17, so that the cavity plate 11 can be circulated with fixed pitch. Note that, a belt-shaped cavity plate which is reciprocally moved on the clamping face of the molding die 6 may be employed instead of the endless cavity plate 11.

In FIGS. 8 and 9, the supporting bases 16a and 16b are vertically moved by a known elevating mechanism (not shown), e.g., a cylinder unit, a ball screw driven by a motor. When the molding die 6 is opened, the cavity plate 11 is moved away from the clamping face of the lower die 8, by the elevating mechanism, and sent forward together with the molded works 2. Therefore, the molded works 2 can be taken out from the molding die 6 together with the cavity plate 11. The plate carrying mechanism 12 is vertically moved together with a lower base 8a of the movable lower base 8.

A cleaning section 18 for cleaning the cavity plate 11 is provided on the upper stream side of the press section 5. The cleaning section 18 has a rotary brush 19, which contacts the surface of the cavity plate 11, an adhesive rubber roller 20a and a cleaning belt 20b. Air sucking sections 21 are provided on the upper and the lower sides of the cavity plate 11. Note that, the rotary brush 19, the adhesive rubber roller 20a and the cleaning belt 20b may be omitted.

A degating section 22, in which solidified useless resin or scraps are separated from the molded works 2, which have been taken out together with the cavity plate 11. In the present embodiment, the molded package sections (molded products) and the scraps of the works 2 are separated upward and downward.

In the degating section 22, a product holding unit 23 is provided above the cavity plate 11; a degate palette 24 is provided under the cavity plate 11. The product holding unit 23 projects rods downward to drop the molded products into the degate palette 24, which has been located under the cavity holes 13, to collect the products. The product holding unit 23 sucks scraps left around the pot holes 14 and ejected scraps, then drops them into a collecting box 25.

The degate palette 24 accommodating the molded works 2 is conveyed from the position under the cavity plate 11 to a transferring position, at which the degate palette 24 is not interfered by the cavity plate 11. At the transferring position, the molded works 2 are sucked and held by the product holding unit 23, then accommodated into a product accommodating section 26. Note that, a mechanism for transferring the molded products from the degate palette 24 to the product accommodating section 26 and a mechanism for accommodating the scraps into the collecting box 25 may be separately installed.

Next, the steps of molding with the resin molding machine will be explained with reference to FIGS. 1–7.

Firstly, the transfer molding die 6 of the press section 5 will be explained. The lower die 8 has a known transfer mechanism including the pot 27, the plunger 28, pressure equalizing units (not shown). Work holding section 8b, on which the works 2 are respectively set, are formed in the clamping face of the lower die 8.

The upper die 7 has the cut 29, resin paths including the gates 30, etc. The clamping face of the upper die 7 including the resin paths is covered with the release film 9. The gates 30 are formed between the clamping face of the upper die 7, which is covered with the release film 9, and the cavity plate 11.

In FIG. 1, the works 2 have been set in the lower die 8 of the molding die 6. The release film 9 is sucked and fixed on the clamping face of the upper die 7. Air is sucked by an air sucking unit (not shown) via air sucking holes 31 of the upper die 7, so that the release film 9 is sucked and fixed on the clamping face of the upper die 7. On the other hand, in the lower die 8, air sucking holes 32 are opened in the work holding sections 8b. Air is sucked by another air sucking unit (not shown) via the air sucking holes 32, so that the substrates of the works 2 are sucked and held in the work holding sections 8b. A resin materials 33, e.g., resin tablet, resin powders, resin grains, liquid resin, resin plate, is set in the pot 27. Note that, the cavity plate 11 has been previously cleaned by the cleaning section 18, and the elevating mechanism (not shown) has moved the cavity plate 11 upward to separate from the lower die 8.

In FIG. 2, when the works 2 are set in the lower die 8, the cavity plate 11 is moved downward to the clamping face of the lower die 8, semiconductor chips of the works 2 are accommodated in the cavity holes 13, and the pot hole 14 corresponds to an opening of the pot 27. As described above, the elevating mechanism, e.g., a cylinder unit, a ball screw driven by a motor, vertically moves the supporting bases 16a and 16b (see FIG. 8) to move the cavity plate 11 upward and downward.

Figure 3:
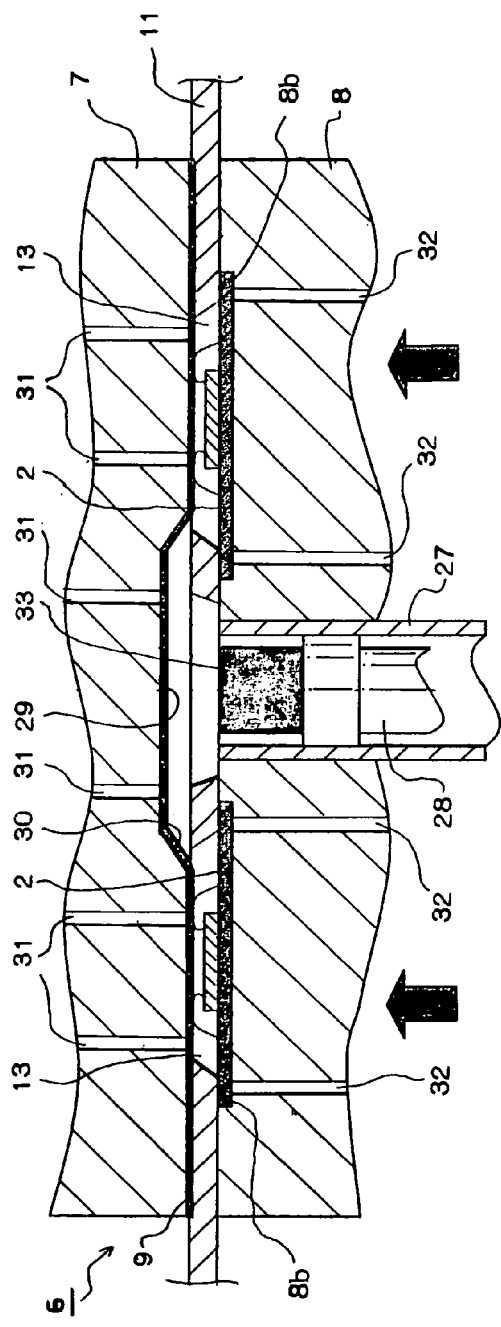

In FIG. 3, the molding die 6 (the upper die 7 and the lower die 8) is closed. The molding die 6 is closed by a clamping mechanism (not shown). To close the molding die 6, the clamping mechanism moves the lower die 8 upward to clamp the works 2 and the cavity plate 11 between the dies 7 and 8.

Figure 4:
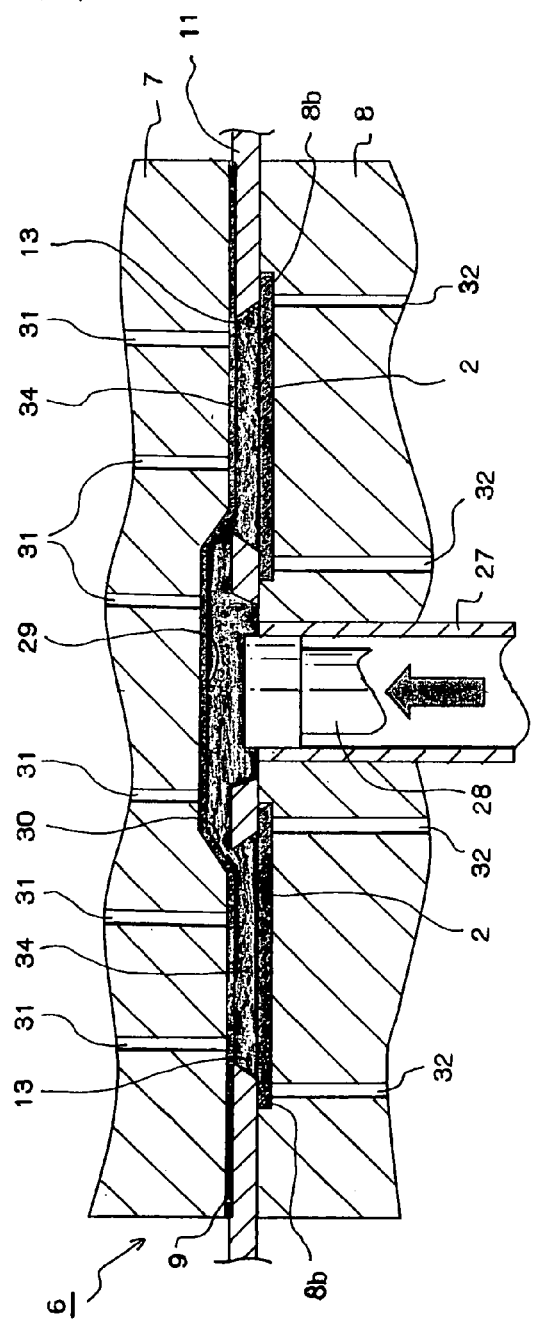

In FIG. 4, the transfer mechanism of the molding die 6 exerts the molten resin 34 and fill the cavity holes 13 with the molten resin 34. The molding die 6 is heated to melt the resin materials 33, and the molten resin 34 is exerted by moving the plunger 28 upward. The molten resin 34, which has been exerted, is sent to the cavity holes 13 via the cul 29 and the gates 30. The molten resin 34 passes through the resin paths formed between the release film 9 and the cavity plate 11 without contacting the clamping faces of the dies 7 and 8. The molten resin 34 in the cavity holes 13 are heated and solidified in the closed molding die 6.

Figure 5:
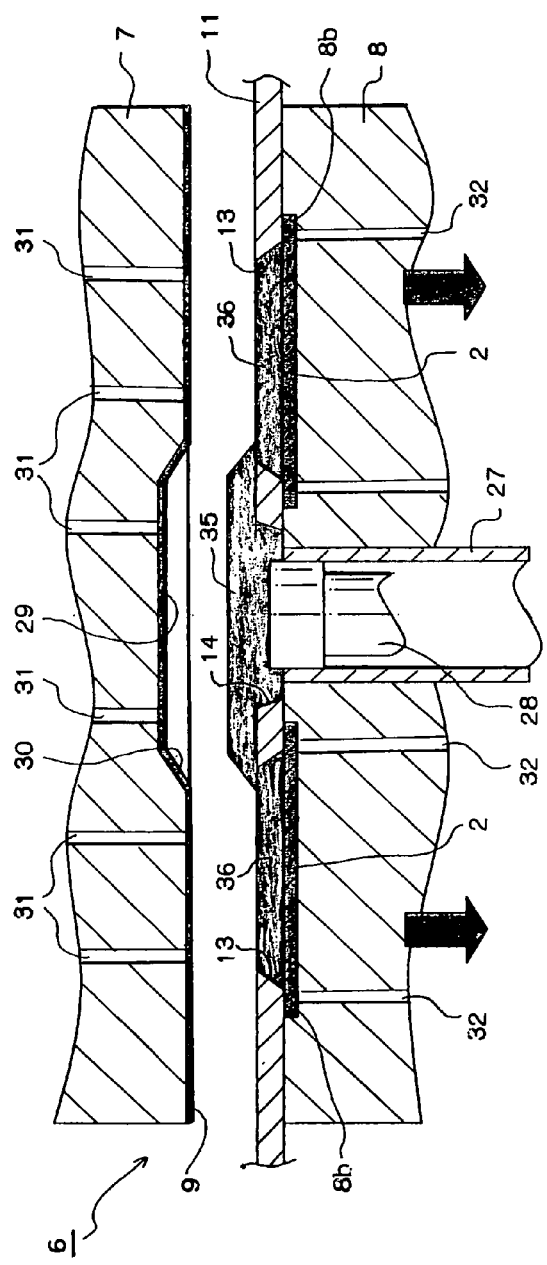

In FIG. 5, the molding die 6 is opened by the clamping mechanism. By moving the lower die 8 downward together with the plate carrying mechanism 12, the molded works 2 are separated from the upper die 7. Namely, the release film 9, which covers the clamping face of the upper die 7, is easily peelable from the solidified resin, so the molded works 2 including package sections 36 and scraps 35 are easily separated from the release film 9 when the lower die 8 is moved downward. Note that, the molded works 2 are still sucked and held in the work holding sections 8b, and the lower die 8 is moved downward together with the cavity plate 11 contacting the clamping face of the lower die 8.

Figure 6:
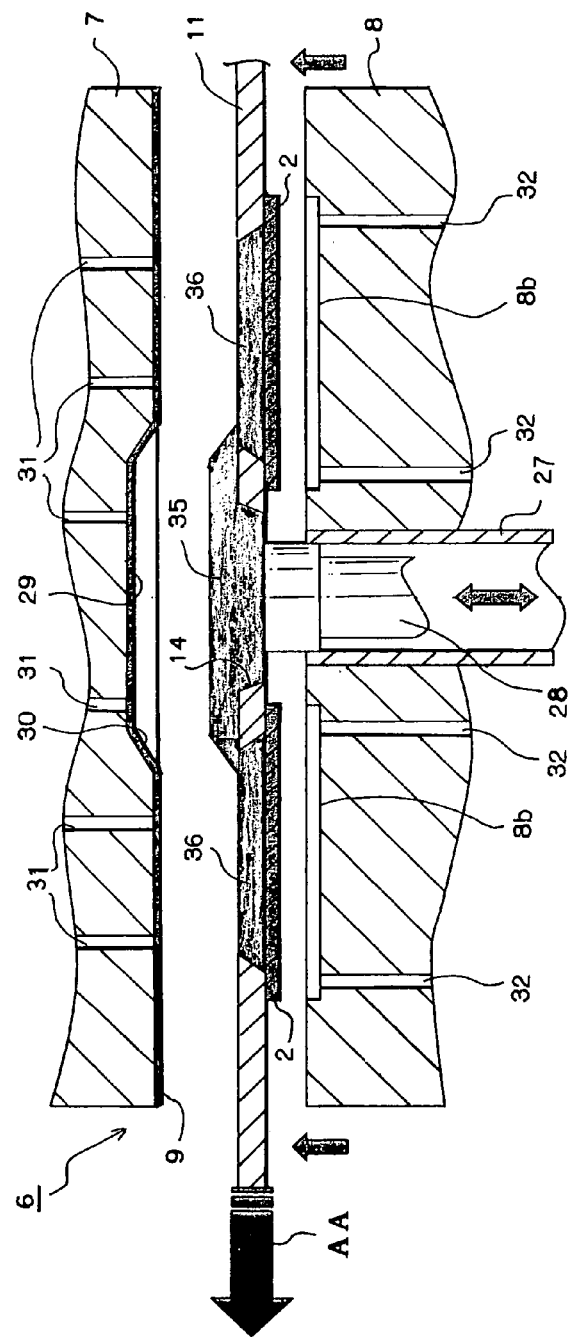

In FIG. 6, the molding die 6 is completely opened, the suction of the molded works 2 is stopped, and the cavity plate 11 is moved upward from the clamping face of the lower die 8 so as to separate the molded works 2 including the package sections 36 and the scraps 35 from the lower die 8. The sprocket wheels 15a and 15b of the plate carrying mechanism 12 are rotated to move the cavity plate 11 a prescribed distance in the direction of an arrow AA. With this action, the molded works 2 is carried from the molding die 6 to the degating section 22. When the cavity plate 11 is carried, a new part of the cavity plate 11, which has the cavity holes 13 and the pot holes 14, is fed to the press section 5.

In FIG. 7, the product holding unit 23 is waiting at the degating section 22 and located above the cavity plate 11; the degate palette 24 has been moved to a position under the cavity plate 11. The product holding unit 23 presses upper faces of the package sections 36, which are exposed in the cavity holes 13, with ejector rods 37, so that the molded works 2 are degated from the scrap 35 and simultaneously separated from the cavity plate 11. Only the molded works 2 are collected in the degate palette 24. The scrap 35 left on the cavity plate 11 is ejected upward by an ejector rod 38, which passes through a through-hole of the degate palette 24, so that the scrap 35 is separated from the cavity plate 11 and sucked by a sucking pad 39 of the product holding unit 23.

The degate palette 24, on which the molded works 2 are mounted, is moved to the transferring position, at which the degate palette 24 is not interfered by the cavity plate 11. On the other hand, the product holding unit 23 carries the scrap 35 held by the sucking pad 39 to the collecting box 25, then receives the molded works 2 from the degate palette 24 at the transferring position. The product holding unit 23 sucks and carries the molded works 2 to the product accommodating section 26 to accommodate the molded works 2.

The cavity plate 11, from which the molded works 2 and the scraps 35 have been separated, is carried to the cleaning section 18 by the plate carrying mechanism 12. At the cleaning section 18, dusts and stuck resin are removed, by the cleaning brush 19, the adhesive rubber roller 20a and the air sucking sections 21, to reuse. In the present embodiment, the cleaning brush 19 brushes the surface of the cavity plate 11, the adhesive rubber roller 20a removes thin resin fins, and the air sucking sections 21 finally suck dust, etc. left on the both faces of the cavity plate 11.

Since the adhesive rubber roller 20a contacts the cleaning belt 20b, thin resin fins are transferred from the adhesive rubber roller 20a to the cleaning belt 20b. The cleaning belt 20b is a long adhesive belt, which is supplied from a feeding reel. An adhesive face of the cleaning belt 20b is pressed onto the rubber roller 20a, so that thin resin fins are transferred from the rubber roller 20a to the cleaning belt 20b. The cleaning belt 20b receives thin resin fins is wound on a collecting reel. When the cleaning belt 20b is completely wound on the collecting reel, a new cleaning belt 20b is set. By transferring thin resin fins from the rubber roller 20a to the cleaning belt 20b, the adhesive face of the rubber roller 20a can be always clean. The cleaning section 18 cleans the upper surface of the cavity plate 11. Another cleaning section for cleaning the lower surface of the cavity plate 11 may be provided.

Note that, by carrying the cavity plate 11, which has been firstly used, to the cleaning section 18, the works 2, which have been secondly molded, are carried to the degating section 24, and simultaneously a new part of the cavity plate 11 is fed to the press section 5. Namely, a series of the above described actions can be continuously executed in the machine. In the present embodiment, the semiconductor chips are matrically arranged in the work 2, and they are simultaneously molded with the resin. The molded work 2 is cut and divided into semiconductor devices by a dicing machine.

In the resin molding machine of the present embodiment, the molten resin 34 does not move on the works 2. Therefore, the works need no special pretreatments, e.g., gold plating, so that number of the steps of manufacturing the semiconductor devices can be reduced.

Since the molten resin 34 is supplied into the cavity holes 13 via the resin paths, which are formed between the release film 9 and the cavity plate 11, maintenance of the molding die 6 can be simplified. The molded works 2 can be separated from the molding die 6 by opening the molding die 6 and moving the cavity plate 11 upward. The molded works 2 can be taken out from the press section 5 together with the cavity plate 11, so that ejector pins can be omitted and the structure of the molding die 6 can be simplified.

Further, the cavity plate 11 can precisely define thickness and shapes of the package sections 36. No resin fins are formed on the molded works 2, and no molten resin 34 leaks outside of the substrate. Therefore, quality of the molded products can be improved.

Second Embodiment

Figure 16A:
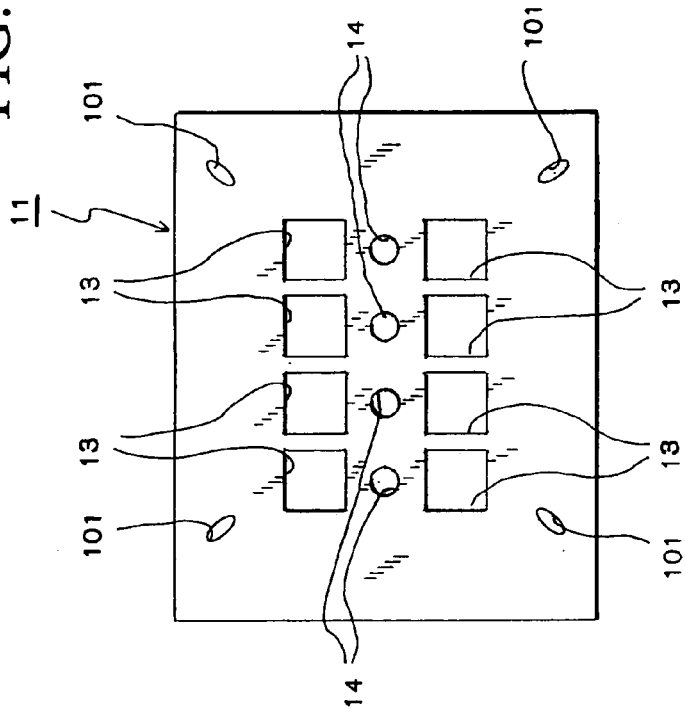
FIG. 16A is an explanation view of the cavity plate.
Figure 16B:
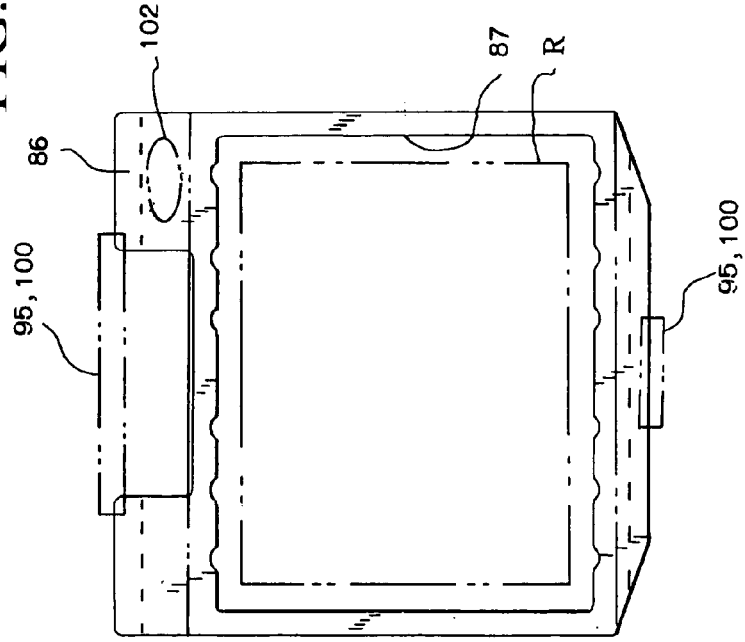
FIG. 16B is an explanation view of a supporting frame.
Figure 16C:
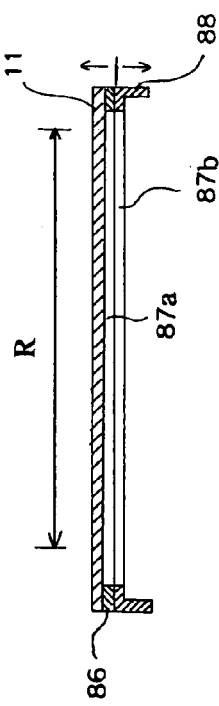
FIG. 16C is an explanation view of a conveying arm.

A second embodiment will be explained with reference to FIGS. 12–16C. FIG. 12 is a plan view of a resin molding machine of the second embodiment; FIG. 13 is a front view of the resin molding machine shown in FIG. 12 seen from an arrow F; FIG. 14 is an explanation view of the resin molding machine shown in FIG. 12 seen from an arrow A;

FIG. 15 is a front view of the resin molding machine shown in FIG. 13 seen from an arrow B; FIG. 16A is an explanation view of the cavity plate; FIG. 16B is an explanation view of a supporting frame; and FIG. 16C is an explanation view of a conveying arm. Note that, the structural elements explained in the first embodiment are assigned the same symbols, and explanation will be omitted. Difference will be mainly explained.

In FIG. 12, a plurality of the cavity plates 11 are circulated on the track 83, so that the cavity plates 11 can be continuously fed to the press section 5. A surface of the track 83 is parallel to the clamping face of the molding die. A preheating section 84, the press section 5, the degating section 22 and a cleaning section 85 are arranged along the track 83. In the present embodiment, four cavity plates 11 are provided to correspond to the sections 84, 5, 22 and 85. The cavity plates 11 are synchronously circulated with actions performed in the sections 84, 5, 22 and 85. Note that, the number of the cavity plates 11 is not limited to four. It may be optionally selected, e.g., one, two, three, five, six.

An example of the cavity plate 11 is shown in FIG. 16A. The cavity plate 11 is a rectangular metal plate. A plurality of the cavity holes 13 and the pot holes 14 are formed in the cavity plate 11 with regular separations. Four positioning holes 101, which are used to correctly position the upper die 7 and the lower die 8 when the molding die clamps the cavity plate 11, are bored in the vicinity of edges of the cavity plate 11. The positioning holes 101 are long holes whose major axes are radially arranged with respect to the center of the cavity plate 11. The cavity plate 11 is made of, for example, stainless steel, titanium, nickel alloy, as well as the dies 7 and 8. Thickness of the cavity plate 11 is designed according to thickness of package sections to be molded, e.g., 0.3–1.0 mm. The cavity plates 11 must have enough heat resistivity, enough abrasion resistivity and enough elasticity, so they may be made of proper synthetic resin, e.g., polyimide, instead of the metal. To easily peel molded products from the cavity plates 11, one or both faces of each cavity plate 11 and inner faces of the cavity holes 13 and the pot holes 14 may be coated with fluoric resin, e.g., Teflon (trademark).

A supporting frame 86 for supporting each cavity plate 11 is shown in FIG. 16B. The cavity plate 11 is correctly positioned in the supporting frame 86 by fitting with pins provided in the vicinity of edges of the supporting frame 86. In FIG. 16C, the cavity plate 11 is correctly positioned on the supporting frame 86. The cavity plate 11 and the supporting plate 86, which have been piled, will be engaged with pins or projections of a carrying arm 88 and carried forward. The supporting frame 86 and the carrying arm 88 have through-holes 87a and 87b, which can enclose a stage area R corresponding to the clamping face of the molding die. By the through-holes 87a and 87b, the molding die is not interfered with the supporting frame 86 and the carrying arm 88 when the molding die clamps the cavity plate 11. At the sections 84, 5, 22 and 85, each action is performed in the stage area R within the through-holes 87a and 87b without escaping the carrying arm 88 from the track 83. The carrying arm 88 is connected to a guide block 93 (see FIG. 13), which circulates along the track 83, by a connector 102 (see FIG. 16B), so that the carrying arm 88 is moved together with the guide block 93. Note that, the supporting frame 86 and the cavity plate 11, which are piled, are vertically moved by lifters 95 and 100.

A mechanism for circulating the carrying arm 88 will be explained. In FIG. 12, an endless belt or chain 91 is provided in a center area of the track 83 and engaged with pulleys or sprockets 89 and 90. As shown in FIG. 13, the pulley 89 is directly driven by a motor 92, so that the belt 91 can be driven. Four guide blocks 93 are connected to the belt 91. Four carrying arms 88 are respectively supported by the guide blocks 93. The guide blocks 93 are circulated on a guide rail 94, which is arranged along the belt 91. Each carrying arm 88 is connected to each guide block 93 by the connector 102.

Successively, the sections provided in the track 83 will be explained. The preheating section 84 is provided on the upstream side of the press section 5 so as to preheat the cavity plates 11. Heat capacity of the thin cavity plates 11 are small, preferably the cavity plates 11 are preheated to temperature of 120–130° C. before reaching the press section 5. By preheating the cavity plates 11, a cycle time of molding works can be shortened, and quality of molded products can be improved.

In FIG. 13, the carrying arm 88, which supports the cavity plate 11 and the supporting frame 86, is carried to the preheating section 84. Lift arms 104 of the lifter 95 (see FIG. 15), which hold both sides of the supporting frame 86, moves the supporting frame 86 upward, so that the cavity plate 11 is pressed onto a preheating plate 84a.

In FIG. 15, the lifter 95 includes, for example, air cylinder units 103, which extend and retract lift arms 104. The lift arms 104 are provided on the both sides of the carrying arm 88, and a line connecting the lift arms 104 perpendicularly crosses the direction of moving the carrying arm 88. The air cylinder units 103 are connected by a connecting shaft 105, which is pierced through the preheating plate 84a. The lift arms 104 are synchronously moved in the vertical direction, and their movement is synchronized by, for example, racks and pinions connected by a shaft. With this structure, the cavity plate 11 can be moved upward and downward with maintaining parallel to the clamping face of the molding die. The both sides of the cavity plate 11 in the preheating section 84 are held by hands 106, which are respectively provided to lower ends of the lift arms 104, and the cavity plate 11 is moved upward and pressed onto the preheating section 84.

As shown in FIG. 13, a resin feeding section 96 is provided under the preheating section 84. The resin feeding section 96 accommodates the resin materials 33, e.g., resin tablets, which have been lined and sent from a feeder, into cassettes and vertically reciprocally moves the cassettes between a tablet position and a transferring position, at which the resin tablets are transferred to a loader 99.

In FIG. 12, a substrate preheating section 97 is provided on the upstream side of the resin feeding section 96. The works 2, on which semiconductor chips are mounted, are accommodated in magazines 3, and two works 2 are simultaneously supplied onto the substrate preheating section 97 by pushers 98. The substrate preheating section 97 makes temperature difference between the substrates of the works 2 and the molding die small so as to shorten a cycle time of molding the works 2.

In FIG. 13, the loader 99 is reciprocally moved between the substrate preheating section 97 and the press section 5. The loader 99 moves to the substrate preheating section 97 and holds the works 2, which have been preheated, then moves to the resin feeding section 96 and holds the resin materials 33. Further, the loader 99 carries the works 2 and the resin materials 33 to the lower die 8 of the press section 5. On the other hand, the carrying arm 88 carries the cavity plate 11, which has been preheated, to the upper die 7 of the press section 5. The works 2 and the cavity plate 11 may be simultaneously or separately carried to the press section 5.

The molding die of the press section 5 has the fixed upper die 7 and the movable lower die 8 as well as the first embodiment. The film feeding mechanism 10, which feeds the release film 9 onto the clamping face of the upper die 7, is provided to the upper die 7. The release film 9 is sucked to fix on the clamping face of the upper die 7. The upper die has the lifter 100, which has the same structure that the lifter 95 has (see FIG. 15). Namely, the cavity plate 11, which has been carried to the press section 5 by the carrying arm 88, is moved upward together with the supporting frame 86, whose both sides are held by hands 106 provided to lower ends of lift arms 104, so that the cavity plate 11 is moved upward and pressed onto the release film 9 covering the clamping face of the upper die 7.

In FIG. 13, the lower die 8 is moved upward and downward by a known clamping mechanism. To close the molding die, the lower die 8 is moved upward and into the through-holes 87a and 87b of the carrying arm 88 and the supporting frame 86, then the lower die 8 clamps the cavity plate 11, which has been located on the clamping face of the upper die 7, with the upper die 7. At that time, the semiconductor chips of the works 2 enter the cavity holes 13 and the substrates 2a of the works 2 are pressed onto the cavity plate 11. When the cavity plate 11 is clamped, the pots of the lower die 8 correspond to the pot holes 14 of the cavity plate 11.

A known transfer mechanism, which includes plungers for exerting the resin materials 33 in the pots, are provided in the lower die 8. While the works 2 are clamped, the transfer mechanism is actuated. The plungers exert the molten resin 34 and send the molten resin 34 to the cavity holes 13 via resin paths formed between the cavity plate 11 and the release film 9 so as to mold the works 2 with the molten rein 34.

When the molding action is completed, the lower die 8 is moved downward to leave from the cavity plate 11, and the lifter 100 moves a lift arm downward. The package sections of the molded works 2 are separated from the release film 9, and the cavity plate 11 is mounted onto the carrying arm 88. The cavity plate 11 used is carried to the degating section 22 by driving the motor 92. The release film 9 is sent forward a prescribed distance so as to prepare new release film for the next molding action. Note that, if no release film is used, the molded works 2 may be ejected from the molding die by pressing the package sections of the molded works 2 with ejector pins when the molding die is opened.

In FIG. 14, when the carrying arm 88 carries the cavity plate 11 to the degating section 22, the degate palette 24 is moved upward to enter the through-holes 87a and 87b of the supporting frame 86 and the carrying arm 88. Ejector rods downwardly press upper faces of the package sections 36, which are exposed in the cavity holes 13, and other ejector rods upwardly press the scrap 35, so that the molded works 2 are degated from the scrap 35 and simultaneously separated from the cavity plate 11. Only the molded works 2 are collected in the degate palette 24 and once moved downward by the carrying arm 88 and carried to the product accommodating section 26 shown in FIG. 12. The scrap 35 is sucked by a sucking unit 81 and carried to a collecting box (not shown).

In FIG. 14, the cavity plate 11 used is held by the carrying arm 88 and carried to the cleaning section 85. The cleaning section 85 has a pair of brushes 85a and 85b, which are capable of moving to and away from an upper surface and a lower surface of the cavity plate 11. The brushes 85a and 85b are respectively covered by hoods 85d, and sucking ducts 85c, which are connected to an air sucking unit (not shown), are respectively connected to the hood 85d. By reciprocally moving the brushes 85a and 85b in the direction BB with brushing the upper and the lower surfaces of the cavity plate 11, the cavity plate 11 can be cleaned to reuse. The cleaning section 85 fully cleans the cavity plates 11.

As described above, the cavity plates 11 are the metal plates, the cavity plates 11 are supported by the frame-shaped carrying arms 88, and the carrying arms 88 are circulated on the track 83 whose surface is parallel to the clamping face of the molding die of the press section 5 so as to continuously mold the works 2. With this structure, even if the cavity plates 11 are repeatedly used, flatness of the cavity plates 11 can be maintained. Therefore, thin products, which have thin package sections, e.g., 0.5 mm, can be properly molded with resin, and quality of the products can be improved.

Since the cavity plates 11, whose heat capacity is relatively small, are preheated before carrying into the press section 5, a cycle time of the series of the molding actions can be shortened. The cavity plates 11 are synchronously circulated with the actions performed in the preheating section 84, the press section 5, the degating section 22 and the cleaning section 85, so that waiting time can be shortened and manufacturing efficiency can be improved. Further, by changing the cavity plates 11, different kinds of works, whose package sections have different sizes, can be molded without a big modification of the machine.

By employing the cavity plates 11, the structure of the molding die can be simplified. Since the resin is supplied into the cavity holes 13 via the resin paths, which are formed between the release film and the cavity plate, maintenance of the molding die can be simplified. Further, the cavity plate 11 can precisely define thickness and shapes of the package sections 36. No resin fins are formed on the molded works 2, and no molten resin leaks outside of the substrate. Therefore, quality of the molded products can be improved.

Third Embodiment

A third embodiment will be explained with reference to FIGS. 17–19. The structure of the resin molding machine of the present embodiment is almost the same as that of the former embodiments, so differences will be mainly explained. The feature of the present embodiment is a compression molding die 40 provided in the press section 5. Liquid resin 47 is used as the resin material. In the present embodiment, an upper die 41 is a movable die, and a lower die 42 is a fixed die, and vice versa. The structural elements explained in the former embodiments are assigned to the same symbols, and explanation will be omitted.

Figure 17:
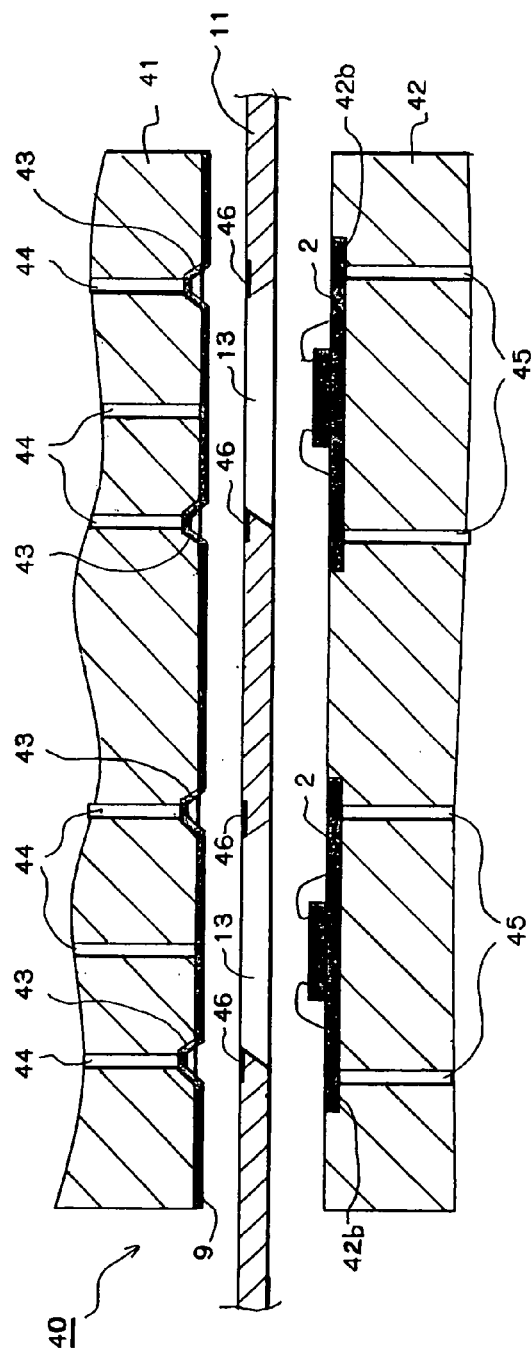

In FIG. 17, cuts and resin paths are not shown in a clamping face of the upper die 41. Overflow cavities 43, which are capable of communicating to the cavity holes 13, are formed in the clamping face of the upper die 41. Air sucking holes 44, which are communicated to an air sucking unit (not shown), are formed in the upper die 41. Some air sucking holes 44 are opened in the overflow cavities 43. By sucking air through the air sucking holes 44, the release film 9 can be fixed on the clamping face of the upper die 41.

The transfer mechanism (not shown) is provided in the lower die 42. Work holding sections 42b are formed in a clamping face of the lower die 42. Air sucking holes 45 are opened in the work holding sections 42b of the lower die 42. The air sucking holes 45 are communicated to the air sucking unit (not shown). By sucking air through the air sucking holes 45, the substrates of the works 2 can be held in the work holding sections 42b.

Overflow gates (grooves) 46, which communicate the cavity holes 13 to the overflow cavities 43 are formed in the cavity plate 11. No pot holes are formed in the cavity plate 11. Note that, the overflow gates 46 may be omitted. If the overflow gates 46 are omitted, the cavity holes 13 are communicated to the overflow cavities 42 when the cavity plate 11 is clamped by the dies 41 and 42. The overflow gates 46 may be formed in the clamping face of the upper die 41 to communicate to the overflow cavities 43. Further, the overflow gates 46 may be connected to two opposite sides or four sides of each cavity hole 13.

Unique actions of the resin molding machine of the present embodiment will be explained with reference to FIGS. 17–19.

In FIG. 17, the molding die 40 is opened, and the works 2 are set in the work holding sections 42b of the lower die 42. The release film 9 is sucked and held on the clamping face of the upper die 41. By sucking air through the air sucking holes 44 of the upper die 41, the release film 9 is held on the clamping face of the upper die 41. On the other hand, by sucking air through the air sucking holes 45 of the lower die 42, the works 2 are sucked and held in the work holding sections 42b of the lower die 42. The cavity plate 11 has been cleaned in the cleaning section 18 or 85 and moved upward, by an elevating mechanism (not shown), to separate from the lower die 42. Note that, the cavity plate 11 may be supported by the carrying arm 88 and carried to the press section 5.

Figure 18:
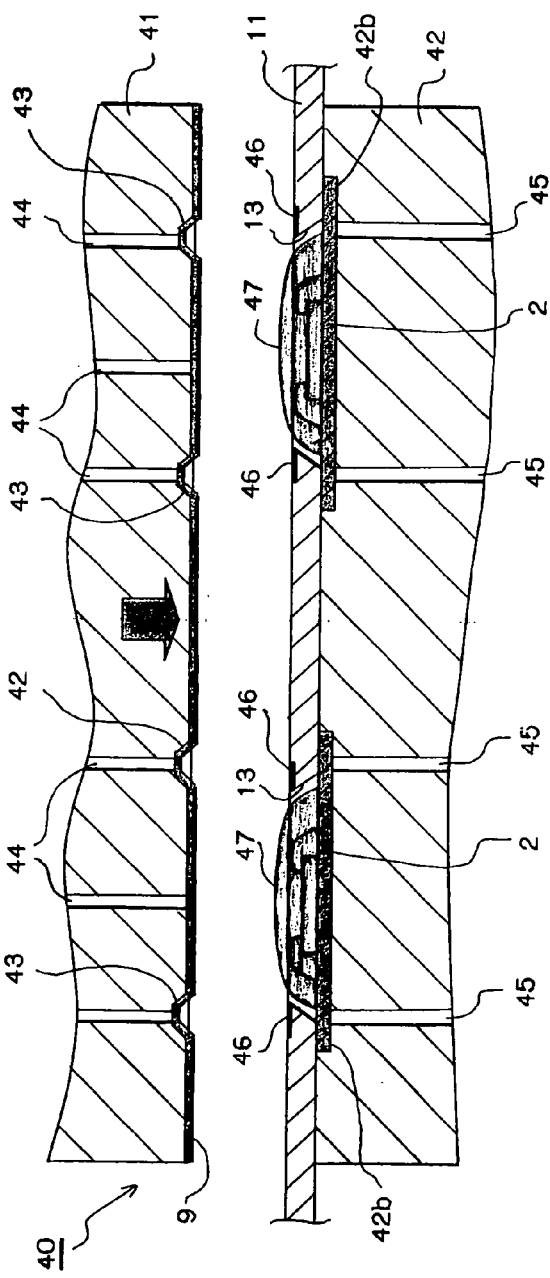

In FIG. 18, upon setting the works 2 in the lower die 42, the cavity plate 11 is moved toward the clamping face of the lower die 42 (or upwardly moved to a position at which the lower die 42 supports the cavity plate 11). The semiconductor chips of the works 2 are accommodated in the cavity holes 13, and the overflow gates 46 correspond to the overflow cavities 42, which are covered with the release film 9. As described above, the cavity plate 11 is moved by actuating the supporting bases 16a and 16b (see FIG. 8) with the elevating mechanism, e.g., a cylinder unit, a mechanism driven by a motor. In another case, the cavity plate 11 may be moved by moving the carrying arm 88 on the track 83 (see FIG. 12).

Next, the liquid resin 47 is supplied into the cavity holes 13 by a proper resin feeding unit, e.g., a dispenser. Volume of the liquid resin 47 may be previously determined according to capacity of the cavity holes 13. In the case of molding the work 2 on which semiconductor chips are metrically arranged, volume of the liquid resin 47 may be previously measured, with considering loss of the resin, before supplying the resin into the cavity holes 13. When the liquid resin 47 is supplied into the cavity hole 13, thickness of the resin corresponding to the center of the cavity hole 13 or the semiconductor chip is made thicker than other parts, so that the semiconductor chip can be uniformly molded with less movement of the resin.

In FIG. 19, the molding die 40 is closed. The upper die 41 is moved downward to clamp the works 2 and the cavity plate 11 between the upper and the lower dies 41 and 42.

When the works 2 and the cavity plate 11 are clamped by the upper and the lower dies 41 and 42, the liquid resin 47 in the cavity holes 13 are uniformly heated and pressurized therein. The resin 47 overflowed from the cavity holes 13 and air are absorbed in the overflow cavities 43 via the overflow gates 46. In this case too, the liquid resin 47 can be supplied into the cavity holes 13 without contacting the clamping faces of the dies 41 and 42. The resin 47 is heated and solidified in the molding die 40 in the clamping state.

Ejecting the molded works 2 and carrying the works 2 from the press section 5 to the degating section 22 are performed as well as the foregoing embodiments. In the present embodiment, volume of the resin 47 overflowed is very small. Therefore, the molded works 2 can be separated from the scraps 35 by pressing upper faces of the package sections 36, which are exposed in the cavity holes 13, with the ejector rods 37, and only the molded works 2 can be collected in the degate palette 24. The scraps 35 left on the cavity plate 11 are held by a hand of the product holding unit 23 (or the sucking unit 81) and carried to the collecting box 25. Accommodating the molded works 2 into the product accommodating section 26 and cleaning the cavity plate 11 are performed as well as the foregoing embodiments.

As shown by two-dot chain lines of FIG. 19, the lower die 42 may have the transfer mechanism including the pots and the plungers. Resin grains may be used instead of the liquid resin 47. If no release film is used, ejector pins are provided.

In the resin molding machine of the present embodiment too, pretreatments of the works 2, e.g., gold plating, are not required, the steps molding the works 2 can be simplified, and the structure of the molding die 40 can be simplified. Since the resin is supplied into the cavity holes 13 via the resin paths, which are formed between the release film and the cavity plate, maintenance of the molding die can be simplified. Further, the cavity plate 11 can precisely define thickness and shapes of the package sections 36. Especially, the volume of the resin can be previously determined or measured, so required volume of the resin can be supplied into the cavity holes 13 without wasting the resin. Further, volume of the scraps 35 can be reduced, so manufacturing cost of the products can be reduced.

Fourth Embodiment

A fourth embodiment will be explained with reference to FIGS. 20 and 21. The structure of the resin molding machine of the present embodiment is almost the same as that of the first and the second embodiments, so differences will be mainly explained. The structural elements explained in the former embodiments are assigned to the same symbols, and explanation will be omitted. In the present embodiment, a transfer molding die 48 is provided in the press section 5. In the molding die 48, an upper die 49 is a fixed die, and a lower die 50 is a movable die.

In FIG. 20, a lower die 50 has cavities 51, the pots 27 and the plungers 28. The works 2 are lead frames on which semiconductor chips are mounted. The resin materials 33 may be a resin tablet, resin grains, liquid resin, etc.

It is difficult feed the release film onto a clamping face of the lower die 50 due to an arrangement of the cavity plate 11, so ejector pins 52 are provided under the cavities 51. The ejector pins 52 are actuated by a known driving mechanism (not shown). When the lower die 50 is moved downward after molding the works 2, the ejector pins 52 upwardly eject the package section 36 of the molded works 2 from bottom faces of the cavities 51, so that the molded works 2 can be separated from the lower die 50.

Air sucking holes 57, which are communicated to an air sucking unit (not shown), are formed in the upper die 49. By sucking air through the air sucking holes 57, the release film 9 can be held on a clamping face of the upper die 49. In FIG. 21, side gates (grooves) 53, each of which communicates the pot 14 to the cavity hole 13, are formed in the cavity plate 11. Note that, the side gates 53 are not essential.

When the works 2 are molded, the molten resin 34, which has been molten by the heated molding die 48, is exerted by moving the plunger 28 upward and sent to the cavity holes 13 via the cul 29 and the gates 30. Since the molten resin 34 runs through the resin paths formed between the cavity plate 11 and the release film 9, the molten resin 34 fills the cavity holes 31 without contacting the clamping faces of the dies 49 and 50. Further, the molten resin 34 runs from the cavity holes 13 to the cavities 51 via gaps between the lead frames and inner faces of the cavities 51. The molten resin 34 is heated and solidified in the closed molding die 48, so that the package sections 36 are formed on the both surfaces of the lead frames 2. Note that, the lower die 50 must be cleaned before starting the next molding actions. The cleaning action may be performed by a cleaning unit or the loader 4 before setting the new works.

By employing the resin molding machine of the present embodiment, the works 2 need no special pretreatments, e.g., gold plating, so that number of the steps of manufacturing the semiconductor devices can be reduced. The ejector pins 52 of the lower die 50 are essential, but the upper die 49 needs no ejector pins due to the release film 9, so that the structure of the molding die 48 can be simplified, and maintenance of the molding die 48 can be simplified.

In the case of feeding no release film to the upper die 49, the ejector pins are provided in the upper die 49 as well as the lower die 50. In the present embodiment, the both surfaces of the work 2 are molded with the resin, but one of surfaces of a work may be molded by the resin molding machine of the present embodiment.

Fifth Embodiment

A fifth embodiment will be explained with reference to FIG. 22. The structure of the resin molding machine of the present embodiment is almost the same as that of the first and the second embodiments, so differences will be mainly explained. The structural elements explained in the former embodiments are assigned to the same symbols, and explanation will be omitted. In the present embodiment, a transfer molding die 59 is provided in the press section 5. In the molding die 59, an upper die 54 is a fixed die, and a lower die 55 is a movable die. In the present embodiment, the works 2 are set in the upper die 54.

Work holding sections 54a are formed in a clamping face of the upper die 54. Air sucking holes 56, which are communicated to an air sucking unit (not shown), are formed in the upper die 54. By sucking air through the air sucking holes 56, the release film 9 is sucked and held on the clamping face of the upper die 54, which includes the work holding sections 54a.

The transfer mechanism including the pots 27 and the plungers 28 is provided in the lower die 55. The culs 29 and the gates 30 are formed in the lower die 55. In the case of feeding no release film onto the clamping face of the lower die 55, the ejector pins 52 are provided in the lower die 55, and they are located under the culs 29 and the cavity holes 13 of the cavity plate 11. The ejector pins 52 are actuated by a known driving unit (not shown), which is provided in the lower die 55. When the lower die 55 is moved downward after molding the works 2, the ejector pins 52 upwardly eject the package section 36 and the scraps 35 of the molded works 2 from bottom faces of the cavities 51, so that the molded works 2 can be separated from the lower die 55.

In the case of feeding the release films 9, which are shown as dotted lines, onto the clamping faces of the both dies 54 and 55, the ejector pins 52 and the driving unit for driving the ejector pins 52 can be omitted.

The cavity plate 11 has the cavity holes 13 and cul holes 58, which are through-holes. The cavity hole 13 defines the shape of the package section 36. A distance between inner faces of the cavity hole 13 is gradually made longer toward the substrate of the work 2. On the other hand, an inner diameter of the cul hole 58 is gradually made shorter toward the clamping face of the upper die 54. Tapered angle of the inner face of the cul hole 58 is adjusted so as not to fall the scrap 35 from the cavity plate 11 while carrying the cavity plate 11.

When the cavity plate 11 is set on the clamping face of the lower die 55, the works 2, in each of which a semiconductor chip is provided on a bottom face, are set on the cavity plate 11. The semiconductor chips are respectively accommodated in the cavity holes 13. The cavity plate 11 and the works 2 are clamped between the upper die 54, in which the release film 9 has been fed on the clamping face, and the lower die 55. The works 2 are molded with the resin in the closed molding die 59. Note that, in the case of using resin tablets as the resin materials 33, the resin materials 33 should be supplied into the pots 27 before the cavity plate 11 is set on the clamping face of the lower die 55.

After the works 2 are molded with resin, the molded works 2 are carried to and separated from the scraps in the degating section 22. A structure of the degating mechanism of the present embodiment is reversed with respect to the structures of the degating mechanisms of the first and the second embodiments. Namely, the product holding unit is located above the cavity plate 11, and the scrap collecting box is located under the cavity plate 11. Bottom faces of the package sections 36, which are exposed in the cavity holes 13, are pressed upward by ejector rods, so that the molded works 2 are separated from the cavity plate 11. The scraps 35 ejected fall into the collecting box. The molded works 2 are held by sucking pads of the product holding unit and carried to the product accommodating section.

By employing the resin molding machine of the present embodiment, the works 2 need no special pretreatments, e.g., gold plating, so that number of the steps of manufacturing the semiconductor devices can be reduced. The ejector pins 52 of the lower die 55 are essential, but the upper die 54 needs no ejector pins due to the release film 9, so that the structure of the molding die 59 can be simplified, and maintenance of the molding die 59 can be simplified.

In the case of feeding no release film to the upper die 54, the ejector pins are provided in the upper die 54 as well as the lower die 55.

Sixth Embodiment

Figure 23:
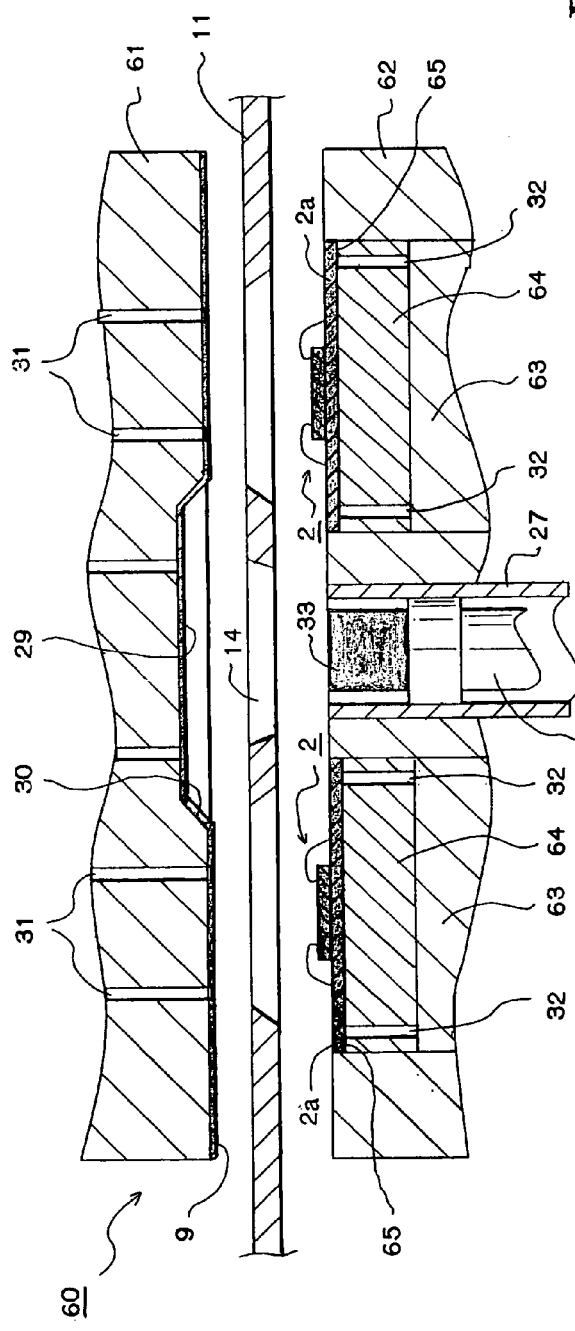
FIG. 23 is an explanation view of a molding die of a sixth embodiment.

A sixth embodiment will be explained with reference to FIG. 23. The structure of the resin molding machine of the present embodiment is almost the same as that of the first and the second embodiments, so differences will be mainly explained. The structural elements explained in the former embodiments are assigned to the same symbols, and explanation will be omitted. In the present embodiment, a transfer molding die 60 is provided in the press section 5. In the molding die 60, an upper die 61 is a fixed die, and a lower die 62 is a movable die.

In the present embodiment, means for adjusting variations of thickness of the substrates 2a of the works 2 is provided to work holding sections 65. The adjusting means adjusts the thickness of the substrates 2a when the molding die 60 clamps the works 2. If the substrate 2a is too thick, an excessive clamping force is applied to the substrate 2a when the molding die 60 clamps the works 2, so that the work 2 is deformed and damaged. Further, the cavity plate 11 cannot contact a clamping face of the lower die 62, so that the molten resin leaks from the cavity hole 13 to the substrate 2a. On the other hand, if the substrate 2a is too thin, a gap is formed between the substrate 2a and the cavity plate 11 when the molding die 60 clamps the works 2, so that the molten resin leaks from the cavity hole 13 to the substrate 2a. Thus, the adjusting means absorbs the variation of the thickness of the substrates 2a.

The lower die 62 has the known transfer mechanism including the pots 27, the plungers 28 and pressure equalizing units (not shown). Adjusting blocks 64 are respectively supported by lower chase blocks 63. Upper faces of the adjusting blocks 64 act as inner bottom faces of work holding sections 65, in which the works 2 will be set. The air sucking holes 32 are formed in the adjusting blocks 64. The air sucking holes 32 are communicated to an air sucking unit (not shown). By sucking air through the air sucking holes 32, the substrates 2a of the works 2 are sucked and held in the work holding sections 65.

The upper die 61 has the culs 29 and the resin paths including the gates 30. A clamping face of the upper die 61 including the resin paths is covered with the release film 9. The resin paths including the gates 30 are formed between the cavity plate 11 and the release film 9. The molding die 60 molds the works 2 with resin as well as the molding dies of the first and the second embodiments.

Next, examples of the adjusting means of the work holding sections 65 will be explained. A first example is to employ the exchangeable adjusting blocks 64. The adjusting block 64 may be exchanged according to thickness of the work 2. By exchanging the adjusting block 64, variations of the thickness of the work 2 can be absorbed. A second example is to employ an elastic body, e.g., coil spring. The elastic body is elastically provided between the adjusting block 64 and the lower chase block 63. Variations of the thickness of the work 2 can be absorbed by the elastic body. A third example is to employ an elevating unit, which is capable of moving the adjusting block 64 upward and downward. For example, a screw shaft and a servo motor constitute the elevating unit. By vertically moving the adjusting block 64, variations of the thickness of the work 2 can be absorbed. A fourth example is to employ the elastic adjusting block 64. Variations of the thickness of the work 2 can be absorbed by the elasticity of the adjusting block 64. A fifth example is to employ the release film. By covering the adjusting block 64 with the release film 9, variations of the thickness of the work 2 can be absorbed by the elasticity of the release film 9. The adjusting means is not limited to the above described examples.

The resin molding machine of the present embodiment has the effects of the resin molding machines of the first and the second embodiments. Further, the adjusting means, which is capable of absorbing the variations of the thickness of the substrates 2a of the works 2, is provided in the work holding sections 65, in which the works 2 are set when the molding die 60 clamps the works 2. Therefore, the deformation and the damage caused by the variations of the works 2 can be prevented. Reliability and multiusability of the resin molding machine can be improved.

Note that, in the present embodiment, the adjusting means are provided in the lower die 62. If the work holding sections are formed in the upper die 61, the adjusting means may be provided in the upper die 61. Further, the molding die 60 may be a compression molding die.

Seventh Embodiment

Figure 24:
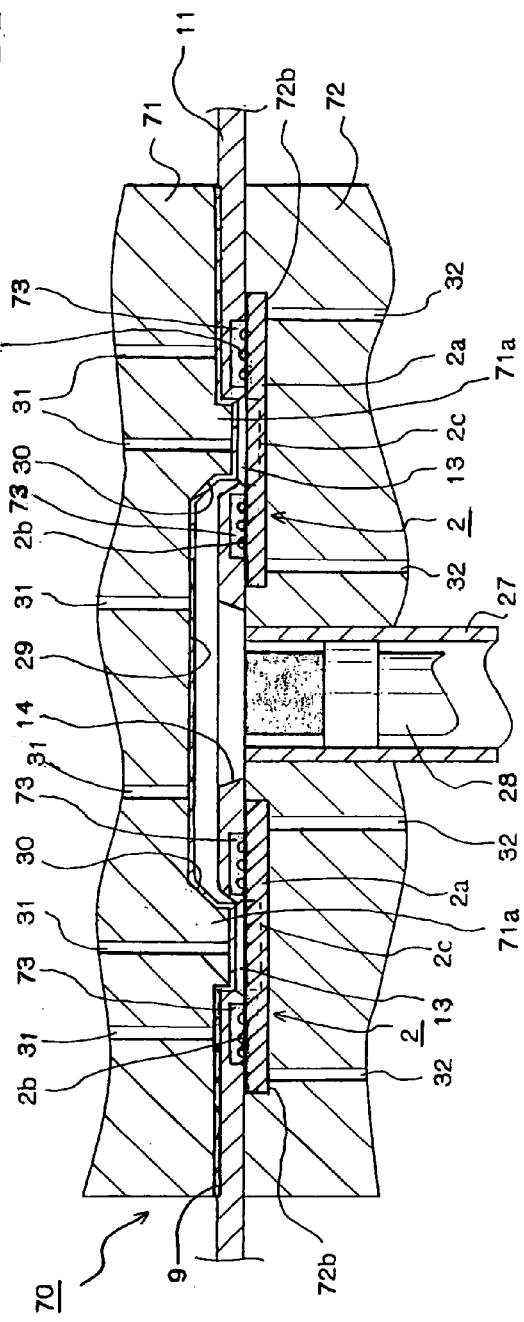
FIG. 24 is an explanation view of a molding die of a seventh embodiment.

A seventh embodiment will be explained with reference to FIG. 24. The structure of the resin molding machine of the present embodiment is almost the same as that of the first and the second embodiments, so differences will be mainly explained. The structural elements explained in the former embodiments are assigned to the same symbols, and explanation will be omitted. In the present embodiment, a transfer molding die 70 is provided in the press section 5. In the molding die 70, an upper die 71 is a fixed die, and a lower die 72 is a movable die.

In the present embodiment, the works 2 are BGA (Ball Grid Allay) type circuit boards. The cavity plate 11 and the molding die 70 will be explained. In the substrate 2a of the BGA type circuit board 2, semiconductor chips are set in a concave section 2c and electrically connected to cable patterns of the substrate 2a. Connecting terminals 2b, e.g., solder balls, metal bumps, are formed on pad sections, which are provided around the concave section 2c and exposed from a protection film layer. The cavity holes 13 of the cavity plate 11 are corresponded to the concave sections 2c, and the cavity plate 11 is piled on the lower die 72. Then, the works 2 are molded with resin in the closed molding die 70. Concave sections 73 for accommodating the connecting terminals 2b are formed in a bottom face of the cavity plate 11, so that the cavity plate 11 is not interfered with the connecting terminals 2b. The connecting terminals 2b are not clamped in the concave sections 73.

The lower die 72 has the known transfer mechanism including the pots 27, the plungers 28 and pressure equalizing units (not shown). Work holding sections 72b, in which the works 2 are set, are formed in a clamping face of the lower die 72.

The upper die 71 has the culs 29 and the resin paths including the gates 30. Projected sections 71a, which respectively face the cavity holes 13, are formed in a clamping face of the upper die 71. The clamping face of the upper die 71 including the resin paths is covered with the release film 9. The gates 30 are formed between the clamping face of the upper die 71, which is covered with the release film 9, the cavity plate 11 and inner faces of the cavity holes 13. The molding die 70 molds the works 2 with resin as well as the molding dies of the first and the second embodiments. Thickness of the package section 36 of the molded work 2, which is formed in the concave section 2c, may be optionally designed. For example, the package section 36 may be slightly projected from the substrate 2a, and the thickness of the package section 36 may be equal to that of the substrate 2a. Variations of the thickness of the package section 36 can be absorbed by adjusting a projected length of the projected section 71a formed in the clamping face of the upper die 71. In the present embodiment, the molding die 70 is the transfer molding die, but the molding die 70 may be a compression molding die.

The resin molding machine of the present embodiment has the effects of the resin molding machines of the first and the second embodiments. Further, the resin molding machine of the present embodiment is capable of molding the BGA type works 2, in which semiconductor chips are set in the concave sections 2c of the substrate 2a and the connecting terminals 2b are provided around the concave sections 2c. Namely, the work 2 whose semiconductor chip and connecting terminals are formed on the same surface of the substrate 2a can be molded without damaging the connecting terminals 2b.

Eighth Embodiment

Figure 25:
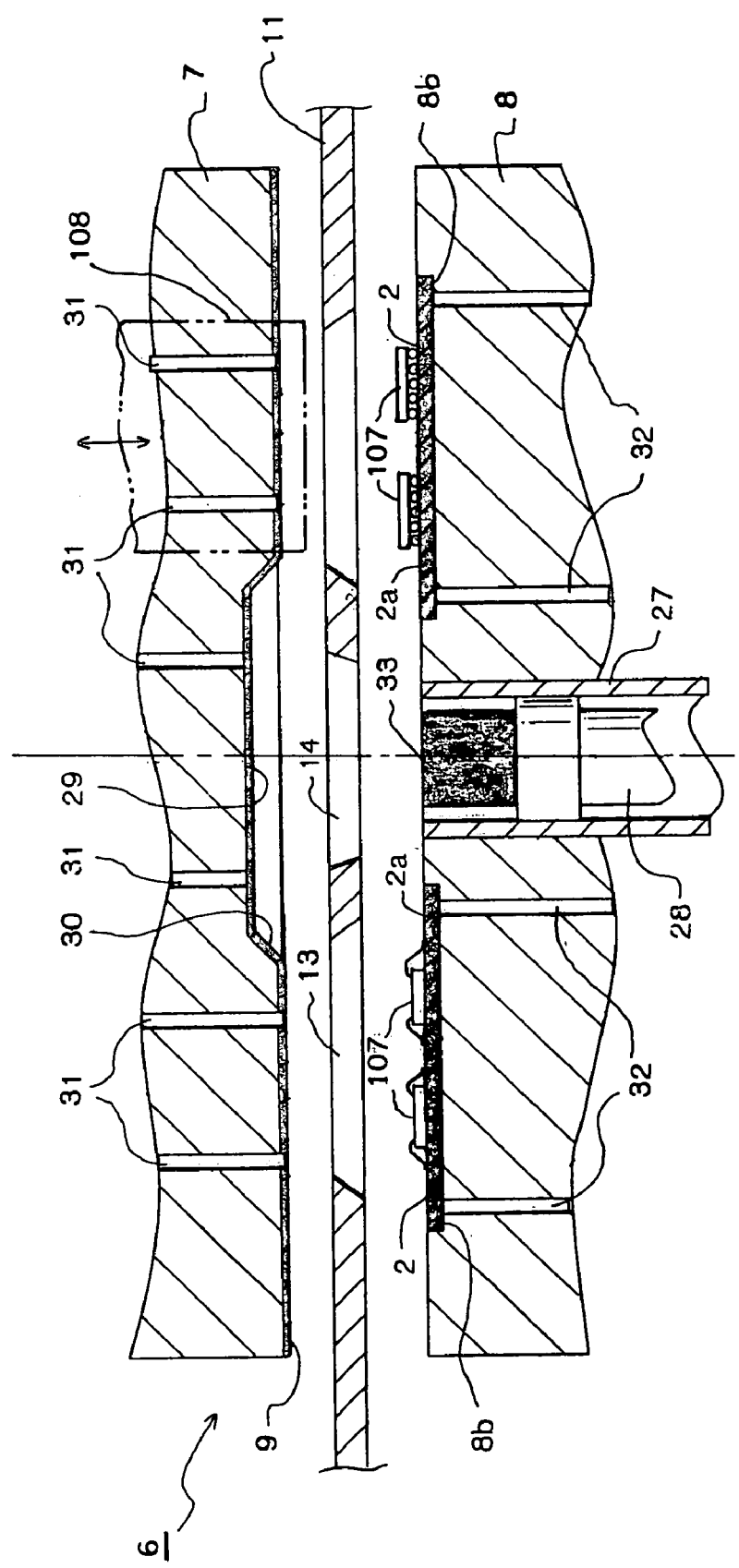
FIG. 25 is an explanation view of a molding die of a eighth embodiment.

An eighth embodiment will be explained with reference to FIG. 25. The structure of the resin molding machine of the present embodiment is almost the same as that of the first and the second embodiments, so differences will be mainly explained. The structural elements explained in the former embodiments are assigned to the same symbols, and explanation will be omitted.

In the present embodiment, two types of the works 2 are molded. A first type of the work 2, which is shown on the left side of FIG. 25, has semiconductor chips 107, which are electrically connected to the substrate 2a by bonding wires like maps. A second type of the work 2, which is shown on the right side of FIG. 25, has semiconductor chips 107, which are flip-chip-connected to the substrate 2a like maps. The transfer molding die 6 is provided in the press section 5. In the molding die 6, an upper die 7 is a fixed die, and a lower die 8 is a movable die. Note that, arrangements of the semiconductor chips 107 are not limited. The semiconductor chips 107 may be metrically arranged on the substrate 2a.

A resin mold area of each work 2 includes the semiconductor chips 107, which are arranged like maps, and one cavity hole 13 of the cavity plate 11 corresponds to one resin mold area. Namely, a plurality of the semiconductor chips 107 are simultaneously resin-molded in one cavity hole 13. In the case of molding the semiconductor chips 107 flip-chip-connected, spaces formed between the semiconductor chips 107 and the substrate 2a must be filled with resin before over-molding the semiconductor chips 107. To fill the spaces with resin, a movable die 108, which is capable of moving in the vertical direction, is provided to the fixed upper die 7. The movable die 108 is moved downward while the molding die 6 clamps the work 2. The movable die 108 is downwardly moved through the cavity hole 13 until reaching the substrate 2a, so that the movable die 108 covers side faces of the semiconductor chips 107. In this state, the spaces are filled with resin. Namely, the resin supplied into a cavity leaks from open sides of the semiconductor chips 107 and runs into the spaces between terminals, e.g., solder balls, so that the spaces under the substrate 2a can be filled with resin. The movable die 108 is moved upward to the upper die 7 immediately before or after the spaces are fully filled with resin. Then, the semiconductor chips 107 are over-molded in the molding die 6.

In the present embodiment, the semiconductor chips 107, which are arranged on the substrate 2a like maps, can be simultaneously molded with resin. At that time, no resin contacts the substrate 2a.

Ninth Embodiment

A ninth embodiment will be explained with reference to FIG. 26. The structure of the resin molding machine of the present embodiment is almost the same as that of the first and the second embodiments, so differences will be mainly explained. The structural elements explained in the former embodiments are assigned to the same symbols, and explanation will be omitted.

In the present embodiment, the works 2 have the semiconductor chips 107, which are electrically connected to the substrates 2a by bonding wires like maps. The transfer molding die 6 is provided in the press section 5. In the molding die 6, the upper die 7 is a fixed die, and the lower die 8 is a movable die.

The semiconductor chips 107 are metrically arranged on the substrates 2a. The semiconductor chips 107 are respectively molded with resin. In the present embodiment, two types of the cavity plates 11 are used. A first type is shown on the left side of FIG. 26. The cavity holes 13, which respectively correspond to the semiconductor chips 107, are formed in the cavity plate 11. Side gates 110, which communicate the pot 27 to the cavity holes 13 via a pot hole 14 and a runner 109, are formed in the upper die 7. The resin materials 33, which has been set in the pot 27, is exerted and sent to the cavity holes 13, via the pot hole 14, the runner 109 and the side gates 110, by moving the plunger 28 upward.

Figure 26:
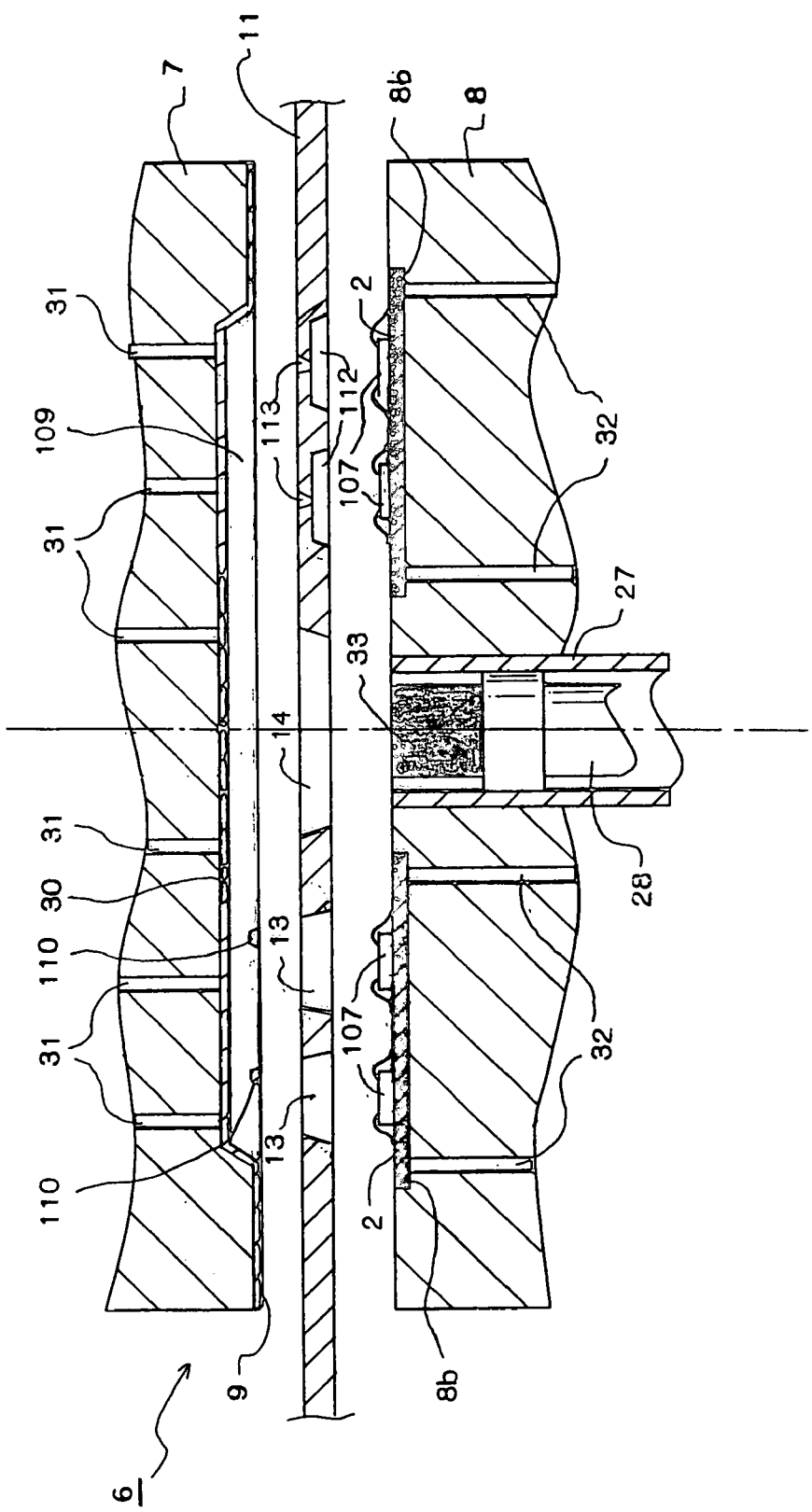
FIG. 26 is an explanation view of a molding die of a ninth embodiment.

A second type is shown on the right side of FIG. 26. The cavity plate 11 has cavities 112, which respectively correspond to the semiconductor chips 107, and vertical gates 113, which respectively communicate to the cavities 112. The vertical gates 113 are communicated to the runner 109. The resin materials 33, which has been set in the pot 27, is exerted and sent to the cavities 112, via the pot hole 14, the runner 109 and the vertical gates 113, by moving the plunger 28 upward.

The resin molding machine of the present embodiment is capable of respectively resin-molding the semiconductor chips 107, which are metrically arranged. At that time, no resin contacts the substrate 2a, so amount of useless resin can be reduced.

Figure 27:
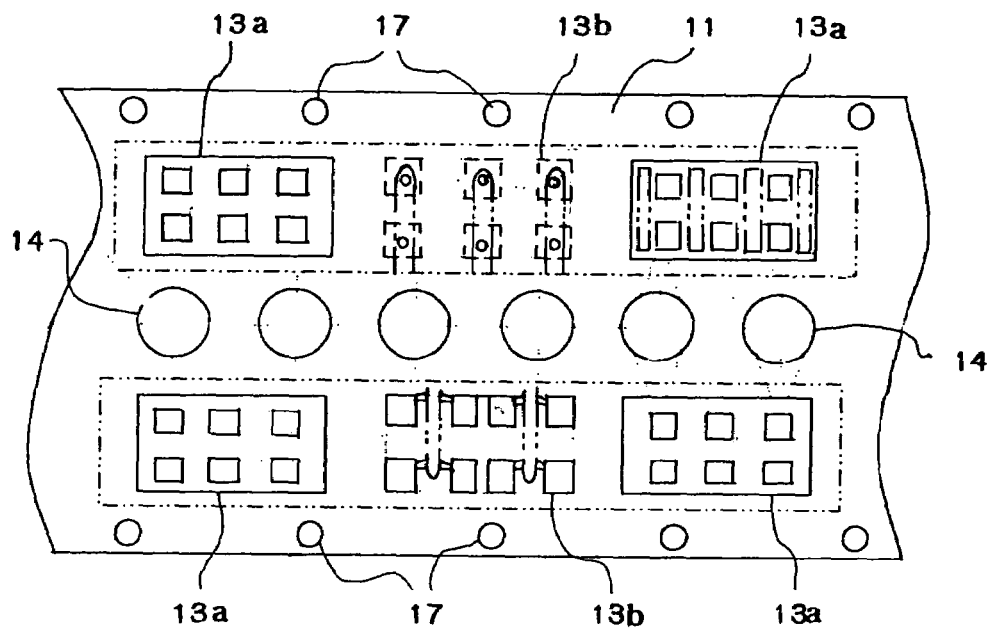
FIG. 27 is an explanation view of a molding die of another cavity plate.

Another example of the cavity plate 11 is shown in FIG. 27. A plurality of types of works can be resin-molded with the cavity plate 11. Namely, different types of works are set in one molding area of the molding die. For example, works, whoso semiconductor chips are simultaneously molded in one cavity hole 13a, and other works, whose semiconductor chips are respectively molded in the cavity holes 13b. In this case, sizes and shapes of the cavity holes and patterns of resin paths including gates are defined according to types of the works to be molded.

In the above described embodiments, the works 2 have the substrates 2a and the semiconductor chips mounted thereon. The resin molding machines of the embodiments can mold works having no semiconductor devices with resin. This example will be explained with reference to FIG. 28. Works 114 are mere substrates. Molding sections 116 are applied on the works 114 to define chip areas 115, in which semiconductor chips will be set. Namely, the molding sections 116 respectively enclose the chip areas 115.

In the above described embodiments, the cavity plates 11 are made of a metal, but the cavity plate may be made of other materials, which have enough heat resistivity, enough abrasion resistivity and enough elasticity and which are easily peelable from resin. Further, the release films may cover both of clamping faces of an upper die and a lower die.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A resin molding machine for molding a work with resin, comprising:

a press section having a molding die for clamping and molding the work;

a cavity plate having a cavity hole, which defines a shape and thickness of a resin mold section of the work;

means for setting the work in said press section;

means for repeatedly carrying said cavity plate into and out from said press section;

means for positioning said cavity plate onto the molding die; and a vertical driving mechanism for moving said cavity plate, which has been carried into said press section by the carrying means, close to and away from a clamping face of the molding die, wherein said vertical driving mechanism moves said cavity plate away from the clamping face of the opened molding die after molding the work, then the carrying means carries said cavity plate so as to separate and take out the molded work from the molding die.

2. The resin molding machine according to claim 1, wherein said cavity plate is a metal belt, which is circulated or reciprocally moved on a clamping face of the molding die.

3. The resin molding machine according to claim 1, wherein said cavity plate is wound on a couple of rollers, and
said cavity plate is separated away from a clamping face of the molding die and conveyed between the rollers with a prescribed pitch after the work is molded.

4. The resin molding machine according to claim 1, wherein said cavity plate has a part to be cleaned, which is sychronously cleaned, on the upper stream side of the said press section in the carrying direction, with the carrying action, and
the part to be cleaned includes an air sucking section capable of sucking an upper face and a lower face of said cavity plate.

5. The resin molding machine according to claim 1, wherein said cavity plate, which is piled on a supporting frame mounted on a carrying arm having a hollow section, is synchronously carried on and along a circulating track, whose surface is parallel to a clamping face of the molding die, by moving the carrying arm by a motor, with molding steps, and
the supporting frame in said press section is moved upward by a lifter so as to press said cavity plate onto an upper die, and a lower die, on which the work is mounted, is moved upward and enters the hollow section of the carrying arm and the supporting frame so as to clamp the work and said cavity plate between the upper die and the lower die for resin molding.

6. The resin molding machine according to claim 1, wherein a lifter of a preheating section moves a supporting frame upward, together with said cavity plate, on the upper stream side of the press section in the carrying direction, so as to press said cavity plate onto a preheating die.

7. The resin molding machine according to claim 1, wherein said cavity plate is circulated via a preheating section, said press section, a degating section and a cleaning section, and
the circulation of said cavity plate is synchronized with actions performed in said sections.

8. The resin molding machine according to claim 1, wherein the work which has been molded is conveyed from said press section to a degating section, at which useless resin is separated from a molded product and they are separately collected.

9. The resin molding machine according to claim 1, wherein the molding die is a transfer molding die including a pair of dies,
a pot, a plunger and a work holding section, on which the work is mounted, are provided in one of the dies,
a cul and resin paths including a runner and a gate are provided in the other die, and
a clamping face of the die including the resin path is covered with a release film.

10. The resin molding machine according to claim 1, wherein the molding die is a transfer molding die, and
a runner and a gate is formed between a clamping face of the transfer molding die, which is covered with a release film, and said cavity plate.

11. The resin molding machine according to claim 1, wherein the molding die is a transfer molding die, whose clamping face including resin paths is covered with a release film, and
said cavity plate has a groove extended from an edge of the cavity hole.

12. The resin molding machine according to claim 1, wherein the molding die is a compression molding die including a pair of dies,
a work holding section, on which the work is mounted, is provided in one of the dies,
an overflow cavity, which communicates to the cavity hole of said cavity plate, is provided in the other die, and
the other die is covered with a release film.

13. The resin molding machine according to claim 1, wherein the molding die is a compression molding die
a work holding section, on which the work is mounted, is provided in one of the dies,
an overflow cavity, which communicates to the cavity hole of said cavity plate, is provided in the other die, which is covered with a release film, and
the resin supplied to the cavity hole of said cavity plate is absorbed into the overflow cavity covered with the release film.

14. The resin molding machine according to claim 1, wherein the molding die is a compression molding die
a work holding section, on which the work is mounted, is provided in one of the dies,
an overflow cavity, which communicates to the cavity hole of said cavity plate, is provided in the other die, which is covered with a release film, and
a groove communicating the cavity hole to the overflow cavity is formed in said cavity plate.

15. The resin molding machine according to claim 1, wherein a work holding section, on which the substrate of the work is mounted, is provided in the molding die, and
means for adjusting variations of thickness of the substrate is provided to the work holding section.

16. A resin molding machine for molding a work with resin, comprising:
a press section having a molding die for clamping and molding the work;
a cavity plate having a cavity hole, which defines a shape and thickness of a resin mold section of the work;
means for setting the work in said press section;
means for repeatedly carrying said cavity plate into and out from said press section; and
means for positioning said cavity plate onto the molding die,
wherein said cavity plate is a metal belt, which is circulated or reciprocally moved on a clamping face of the molding die.

17. A resin molding machine for molding a work with resin, comprising:
a press section having a molding die for clamping and molding the work;
a cavity plate having a cavity hole, which defines a shape and thickness of a resin mold section of the work;
means for setting the work in said press section;
means for repeatedly carrying said cavity plate into and out from said press section; and
means for positioning said cavity plate onto the molding die,
wherein said cavity plate is wound on a couple of rollers, and
said cavity plate is separated away from a clamping face of the molding die and conveyed between the rollers with a prescribed pitch after the work is molded.

* * * * *